United States Patent
Lu

(10) Patent No.: US 8,759,911 B2
(45) Date of Patent: Jun. 24, 2014

(54) SEMICONDUCTOR DEVICE

(75) Inventor: Hong-fei Lu, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 2 days.

(21) Appl. No.: 13/515,572

(22) PCT Filed: Dec. 18, 2009

(86) PCT No.: PCT/JP2009/071186
§ 371 (c)(1),
(2), (4) Date: Jun. 13, 2012

(87) PCT Pub. No.: WO2011/074124
PCT Pub. Date: Jun. 23, 2011

(65) Prior Publication Data
US 2012/0248532 A1    Oct. 4, 2012

(51) Int. Cl.
*H01L 27/102* (2006.01)
*H01L 29/06* (2006.01)

(52) U.S. Cl.
CPC ......... *H01L 27/1022* (2013.01); *H01L 29/0696* (2013.01)
USPC .............. 257/334; 257/E27.06; 257/E27.072; 257/E29.027; 257/E29.197; 257/E29.201; 438/270

(58) Field of Classification Search
CPC . H01L 27/102; H01L 27/1022; H01L 27/105; H01L 29/0696
USPC ............. 257/334, E27.06, E27.074, E29.027, 257/E29.197, E29.198, E29.201, E21.383; 438/270
See application file for complete search history.

(56) References Cited

U.S. PATENT DOCUMENTS 5,329,142 A    7/1994   Kitagawa et al.
5,459,339 A *  10/1995  Sakurai et al. ................ 257/167
5,751,024 A    5/1998   Takahashi
(Continued)

FOREIGN PATENT DOCUMENTS

JP    05-243561 A    9/1993
JP    08-316479 A    11/1996
(Continued)

OTHER PUBLICATIONS

International Search Report issued in PCT/JP2009/071186 dated Mar. 16, 2010.

*Primary Examiner* — Allan R Wilson
(74) *Attorney, Agent, or Firm* — Rossi, Kimms & McDowell LLP

(57) ABSTRACT

Plural island-form emitter cells (22) having a p-base region (23) and an $n^+$ emitter region (24) are provided, distanced from each other, on a main surface of an $n^-$ layer (21). A trench (25) deeper than the p-base region (23) is formed on either side of the emitter cell (22). A first gate electrode (26) is embedded in the trench (25) across a first gate insulating film (41). A second gate electrode (27) that electrically connects first gate electrodes (26) is provided, across a second gate insulating film (40), on a surface of a region of the p-base region (23) sandwiched by the $n^+$ emitter region (24). A conductive region (28) that electrically connects second gate electrodes (27) is provided, across a third gate insulating film (42), on a surface of the $n^-$ layer (21). A contact region (29) that is isolated from the second gate electrode (27), and that short circuits the $n^+$ emitter region (24) and p-base region (23), is provided.

12 Claims, 20 Drawing Sheets

(56) References Cited

U.S. PATENT DOCUMENTS

| | | |
|---|---|---|
| 6,303,410 B1 | 10/2001 | Baliga |
| 6,380,586 B1 | 4/2002 | Yoshikawa |
| 6,566,691 B1 * | 5/2003 | Inoue et al. .................. 257/139 |
| 6,936,893 B2 * | 8/2005 | Tanaka et al. ................. 257/341 |
| 7,319,257 B2 * | 1/2008 | Yamaguchi et al. .......... 257/331 |
| 8,334,565 B2 * | 12/2012 | Yoshikawa .................... 257/330 |
| 2003/0116807 A1 | 6/2003 | Matsuda |
| 2003/0141542 A1 | 7/2003 | Ishimura |
| 2005/0151187 A1 | 7/2005 | Wakimoto et al. |
| 2005/0161768 A1 | 7/2005 | Sugiyama et al. |
| 2006/0163649 A1 | 7/2006 | Otsuki |
| 2010/0052011 A1 * | 3/2010 | Harada ......................... 257/139 |

FOREIGN PATENT DOCUMENTS

| | | |
|---|---|---|
| JP | 2001-217419 A | 8/2001 |
| JP | 3257186 B2 | 12/2001 |
| JP | 2003-224278 A | 8/2003 |
| JP | 2003-258253 A | 9/2003 |
| JP | 2005-175425 A | 6/2005 |
| JP | 2005-191221 A | 7/2005 |
| JP | 2006-210547 A | 8/2006 |
| JP | 3924975 B2 | 3/2007 |
| JP | 2007-088010 A | 4/2007 |
| JP | 2007-281149 A | 10/2007 |

* cited by examiner

SEMICONDUCTOR DEVICE

TECHNICAL FIELD

The present invention relates to a semiconductor device including a trench gate structure.

BACKGROUND ART

A power device performs a central role as a switching element of a power conversion device, such as an inverter or a converter. Even among power devices, an insulated gate bipolar transistor (IGBT) in particular has good gate controllability, and can achieve low on-voltage using a conductivity modulation effect. Therefore, the IGBT is widely used in various voltage regions. A planar gate IGBT is mainly used in a breakdown voltage class of 3,300 V or more. A planar gate IGBT includes a gate electrode on a surface of a semiconductor substrate. Meanwhile, the application of a trench gate structure IGBT is predominant in a breakdown voltage class of 1,700 V or less. In a trench gate structure IGBT, a gate electrode is embedded across an oxide film in a groove (trench) formed in a surface of a semiconductor substrate.

A trench gate structure can have a finer cell structure than a planar gate structure. Also, a trench gate structure does not have a JFET region (a region sandwiched by adjacent p-base regions, which is a portion in which current concentrates) unique to a planar gate structure. Therefore, it is possible to reduce the on-voltage further in a trench gate structure than in a planar gate structure. Also, when the IGBT is in an on-condition, the greater part of an on-voltage drop, which leads to conduction loss, is a voltage drop in a drift region. Because of this, strengthening a so-called injection enhancement (IE) effect, wherein carriers (electrons and holes) are confined as far as possible in the drift region, also leads to low on-voltage. As a surface structure having the IE effect, there is, for example, an IEGT (injection enhanced gate transistor) structure, wherein one portion of an inversion layer channel is inactive, and holes are amassed in the drift region in the vicinity of the channel portion (for example, refer to Patent Document 1). Also, there is a microcell structure IGBT, wherein a p-base layer is partially formed in a silicon mesa portion sandwiched by trench side walls (for example, refer to Patent Document 2).

FIG. 20 shows a plan layout diagram of a microcell structure IGBT described in Patent Document 2. A gate insulating film, an interlayer insulating film, an emitter electrode, and a passivation film are omitted from FIG. 20. FIG. 21 shows a sectional view along a section line A-A' in FIG. 20. The section line A-A' intersects a trench and an emitter cell. In the specification and attached drawings, a layer or region being prefixed by n or p means that a large number of electrons or positive holes respectively are carriers. Also, + or − appended to n or p means that there is a higher impurity concentration or lower impurity concentration than in a layer or region to which + or − is not appended.

As shown in FIG. 20 and FIG. 21, a trench 1 is formed in a stripe form. A gate electrode 2 is embedded across a gate insulating film 3 in the trench 1. An emitter cell 7 including a p-base region 4, an n⁺ emitter region 5, and a p⁺ region 6 is disposed at every predetermined interval W in a mesa portion between neighboring trenches 1. The emitter cell 7 is disposed alternately, leaving a predetermined distance L, in the mesa portion on either side of one trench 1. In each emitter cell 7, an emitter electrode 10 is electrically connected to the n⁺ emitter region 5 and p⁺ region 6 across a contact region 9 that penetrates an interlayer insulating film 8. The emitter electrode 10 and gate electrode 2 are isolated by the interlayer insulating film 8. A passivation film 11 is provided on the emitter electrode 10. An n-buffer layer 13, a p-collector layer 14, and a collector electrode 15 are provided on a main surface of the n⁻ layer 12 on the side opposite a main surface on the emitter cell 7 side. In FIG. 20, a region bounded by a two-dot chain line indicates an active portion unit cell 16. The dimension of the active portion unit cell 16 in the longitudinal direction of the trench 1 is W/2.

Also, there is known a so-called carrier stored trench-gate bipolar transistor (CSTBT). A CSTBT includes an n-layer in the vicinity of the channel with an impurity concentration higher than that of the drift region. Because of this, holes accumulate in the drift region (for example, refer to Patent Document 3). Also, there is known a structure wherein, in order to suppress an electric field in the vicinity of the n-layer in the vicinity of the channel, one portion of a trench gate is short circuited with the emitter. Also, there is known a wide-pitch structure wherein, in order to increase short circuit capability, saturation current is reduced by lengthening the trench pitch in one portion (for example, refer to Patent Document 4). In this way, the channel density of the trench IGBT is lower, in principle or in design, than a channel density that can be provided in a trench side surface.

Meanwhile, the manufacturing process of a trench gate structure is more complicated than the manufacturing process of a planar gate structure. Because of this, when comparing chip cost in a trench gate IGBT and planar gate IGBT, the cost in the trench gate IGBT is higher. Consequently, in order to provide a switching device with still higher added value at a low cost, it is necessary to consider a device structure that can be manufactured more simply, while maintaining IGBT performance. As one example thereof, there is known a structure of an IGBT that includes a planar gate and a trench gate (for example, refer to Patent Document 5).

FIG. 22 shows a sectional view of an IGBT described in Patent Document 5. As shown in FIG. 22, the n⁺ emitter region 5 is formed distanced from the trench 1 in the p-base region 4. The gate insulating film 3 and gate electrode 2 are provided on a surface of the p-base region 4 between the n⁺ emitter region 5 and trench 1, along a side wall and bottom surface of the trench 1, overlapping one portion of the n⁺ emitter region 5. Consequently, an inversion layer channel is formed along a trench side wall portion of the p-base region 4 and a substrate surface of a planar gate portion. A structure similar to the device structure shown in FIG. 22 is also disclosed in another patent application (for example, refer to Patent Document 6 and Patent Document 7).

RELATED ART DOCUMENTS

Patent Documents

Patent Document 1: JP-A-5-243561
Patent Document 2: JP-A-2006-210547
Patent Document 3: JP-A-8-316479
Patent Document 4: JP-A-2003-224278
Patent Document 5: U.S. Patent Document No. 6,303,410
Patent Document 6: JP-A-2007-88010
Patent Document 7: JP-A-2007-281149

OUTLINE OF THE INVENTION

Problems that the Invention is to Solve

In the heretofore known microcell structure IGBT, a gate insulating film capacitance $C_{ex}$ between the emitter cells is expressed by the following Expression (1). $C_{ex}$ is mirror capacitance. Note that, in Expression (1), $W_{Trench}$ is the width of the trench, while $D_{Trench}$ is the depth of the trench. L is the distance between emitter cells disposed on either side of one trench. $\epsilon_0$ is a vacuum permittivity, while $\epsilon_r$ is a gate insulating film relative permittivity. $t_{ox}$ is the thickness of the gate insulating film.

(Expression 1)

$$C_{ex} = (W_{Trench}L + 2LD_{Trench})\varepsilon_0 \frac{\varepsilon_r}{t_{ox}} \quad (1)$$

However, in the heretofore known microcell structure IGBT, as a gate trench continuing from a region in which there is an emitter cell is also formed in a region between emitter cells in which there is no emitter cell, the gate insulating film in the trench is long. Because of this, the mirror capacitance is large. When the mirror capacitance is large, there is a problem in that the element drive loss increases. Also, as time is needed for a charging and discharging of mirror capacitance, an element turning on and turning off period lengthens. Because of this, there is a problem in that switching loss of the element itself increases. Also, when the gate voltage is raised by the effect of a bus (collector) voltage surge when the IGBT is in an off-condition, there is a danger of the IGBT malfunctioning and shifting to an on-condition.

The invention, having been contrived bearing the above in mind, has an object of providing a trench gate structure semiconductor device with a small mirror capacitance.

Means for Solving the Problems

In order to solve the heretofore described problems, thus achieving the object, a semiconductor device according to the invention of claim 1 is characterized by including a first conductivity type semiconductor layer, a plurality of island-form cells provided distanced from each other on a first main surface of the first conductivity type semiconductor layer, a second conductivity type semiconductor region provided in the cell, a first conductivity type semiconductor region provided in the second conductivity type semiconductor region, a first insulating film provided inside a trench deeper than the second conductivity type semiconductor region formed on either side of the cell, a first electrode embedded in the trench across the first insulating film, a second insulating film provided on a surface of a region of the second conductivity type semiconductor region sandwiched by the first conductivity type semiconductor region, a second electrode, formed on the second insulating film, that electrically connects first electrodes, a third insulating film provided on a surface of the first conductivity type semiconductor layer, a conductive region, formed on the third insulating film, that electrically connects second electrodes, and a contact region that is isolated from the second electrode, and that short circuits the second conductivity type semiconductor region and the first conductivity type semiconductor region provided in the region.

Also, a semiconductor device according to the invention of claim 2 is characterized in that, in the invention according to claim 1, the second electrode and the conductive region also act as a wire that transmits a gate signal.

Also, a semiconductor device according to the invention of claim 3 is characterized in that, in the invention according to claim 1, plural trench groups, each including the plural trench, are disposed distanced from each other, the plural trench are disposed aligned in a direction intersecting with the longitudinal direction of the trench in each trench group, and the cells are disposed alternately in neighboring trench groups.

Also, a semiconductor device according to the invention of claim 4 is characterized in that, in the invention according to claim 3, the second electrode and the conductive region also act as a wire that transmits a gate signal.

Also, a semiconductor device according to the invention of claim 5 is characterized by, in the invention according to claim 4, including a third electrode electrically connected to the contact region, a second conductivity type semiconductor layer provided on a second main surface of the first conductivity type semiconductor layer, and a fourth electrode electrically connected to the second conductivity type semiconductor layer.

Also, a semiconductor device according to the invention of claim 6 is characterized in that, in the invention according to claim 1, the trenches disposed on either side of the cell are connected, and the cell is provided in a region closed off by the trenches disposed on either side of the cell.

Also, a semiconductor device according to the invention of claim 7 is characterized in that, in the invention according to claim 6, the second electrode and the conductive region also act as a wire that transmits a gate signal.

Also, a semiconductor device according to the invention of claim 8 is characterized in that, in the invention according to claim 6, the cell is also disposed in one portion of regions between neighboring regions closed off by the trenches, the second conductivity type semiconductor region provided in the cell between regions closed off by the trenches extends farther in the longitudinal direction of the trench than the trenches surrounding the region closed off by the trenches, and the second electrode that electrically connects first electrodes is also provided across the second insulating film on a surface of a region of the second conductivity type semiconductor region provided in the cell between regions closed off by the trenches sandwiched by the first conductivity type semiconductor region provided in the second conductivity type semiconductor region.

Also, a semiconductor device according to the invention of claim 9 is characterized in that, in the invention according to claim 8, the second electrode and the conductive region also act as a wire that transmits a gate signal.

Also, a semiconductor device according to the invention of claim 10 is characterized in that, in the invention according to claim 8, plural trench groups, each including the plural trench, are disposed distanced from each other, plural trench are disposed aligned in a direction intersecting with the longitudinal direction of the trench in each trench group, and the cells between regions closed off by the trenches are disposed alternately in neighboring trench groups.

Also, a semiconductor device according to the invention of claim 11 is characterized in that, in the invention according to claim 10, the second electrode and the conductive region also act as a wire that transmits a gate signal.

Also, a semiconductor device according to the invention of claim 12 is characterized by, in the invention according to claim 11, including a third electrode electrically connected to the contact region, a second conductivity type semiconductor layer provided on a second main surface of the first conductivity type semiconductor layer, and a fourth electrode electrically connected to the second conductivity type semiconductor layer.

According to the invention, the trench gate structure is provided only in a region in which there is a cell, and is not provided in a region between cell and cell in which there is no cell. Consequently, the width of gate insulating film in the gate trench is shorter than that heretofore known. Also, using the second electrode and the conductive region, it is possible to transmit a gate signal to the gate electrode of the cells scattered in island-form, even though there is no trench gate structure in a region between cell and cell in which there is no cell.

Advantage of the Invention

The semiconductor device according to the embodiment is a trench gate structure semiconductor device that achieves the advantage of having a small mirror capacitance.

MODE FOR CARRYING OUT THE INVENTION

Figure 1:
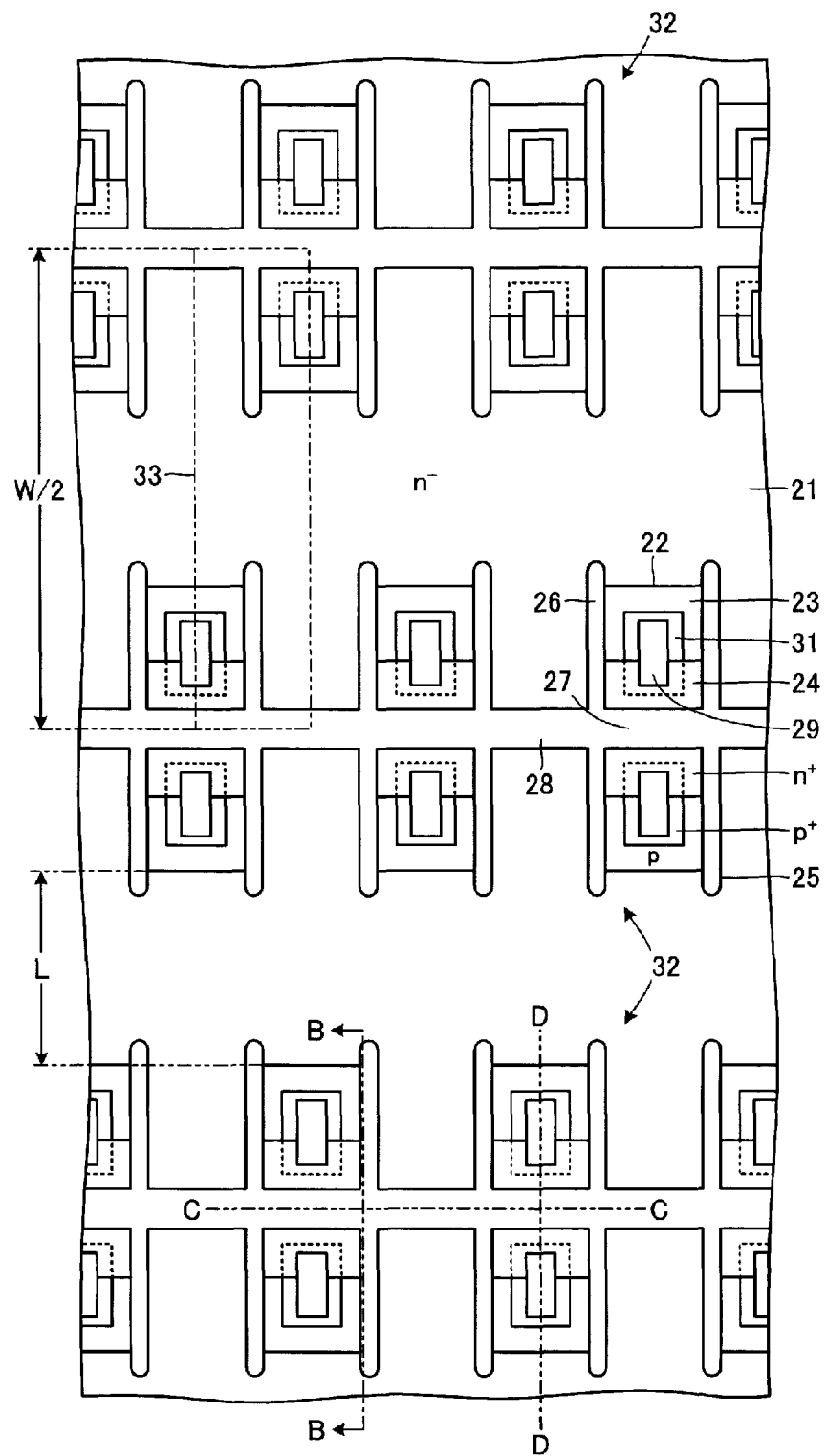
FIG. 1 is a plan layout diagram showing Working Example 1 of a semiconductor device according to an embodiment.

Hereafter, a description will be given, based on the drawings, of working examples of a semiconductor device according to the invention. The invention is not limited by these working examples. The same reference numerals and signs are given to identical configurations in the following description of the working examples and attached drawings, and a redundant description thereof is omitted.

WORKING EXAMPLE 1

Figure 2:
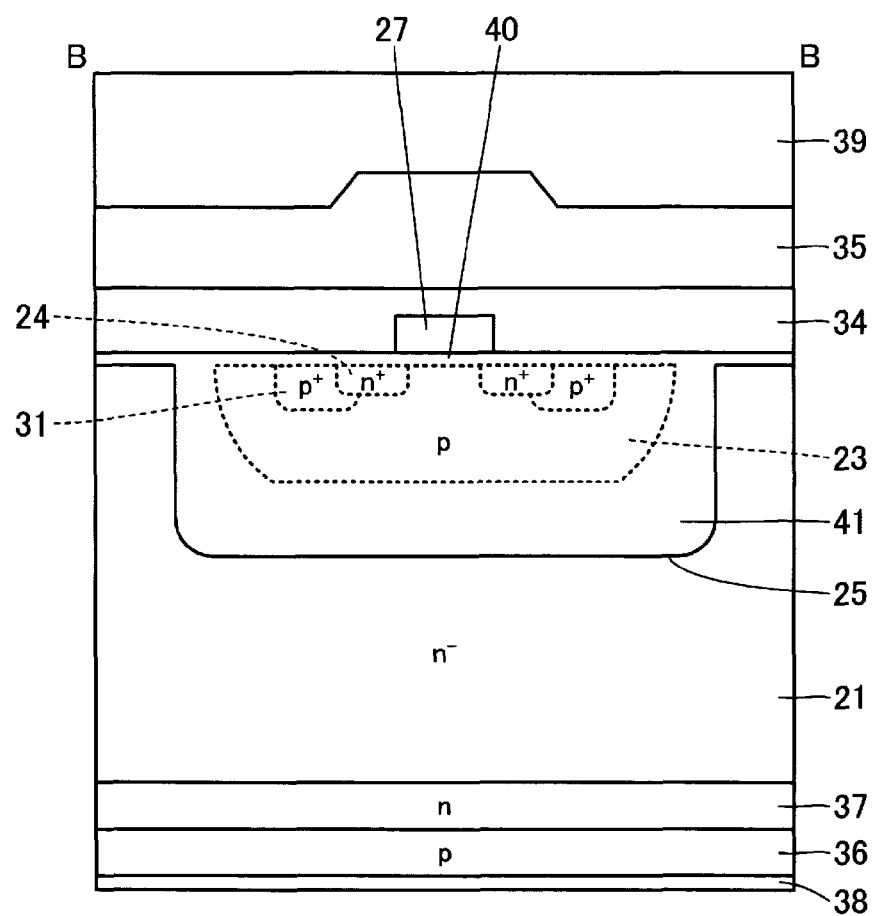
FIG. 2 is a sectional view showing Working Example 1 of the semiconductor device according to the embodiment.
Figure 3:
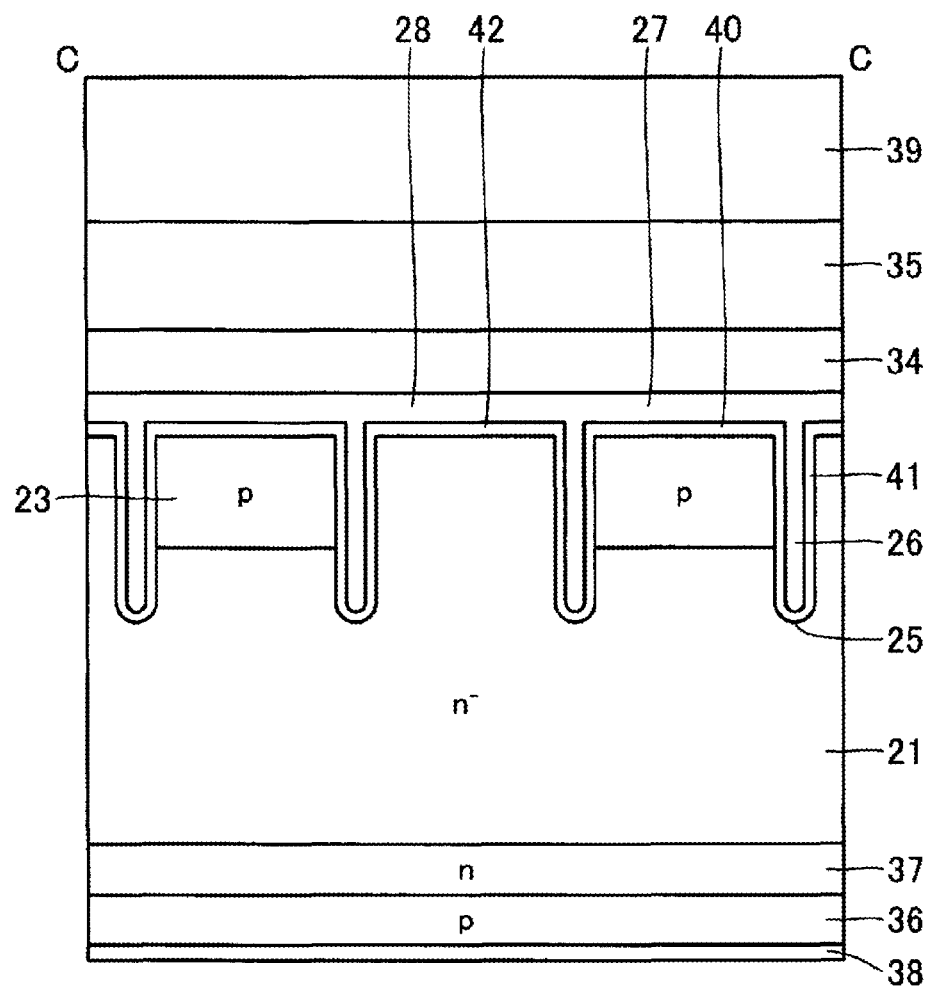
FIG. 3 is a sectional view showing Working Example 1 of the semiconductor device according to the embodiment.
Figure 4:
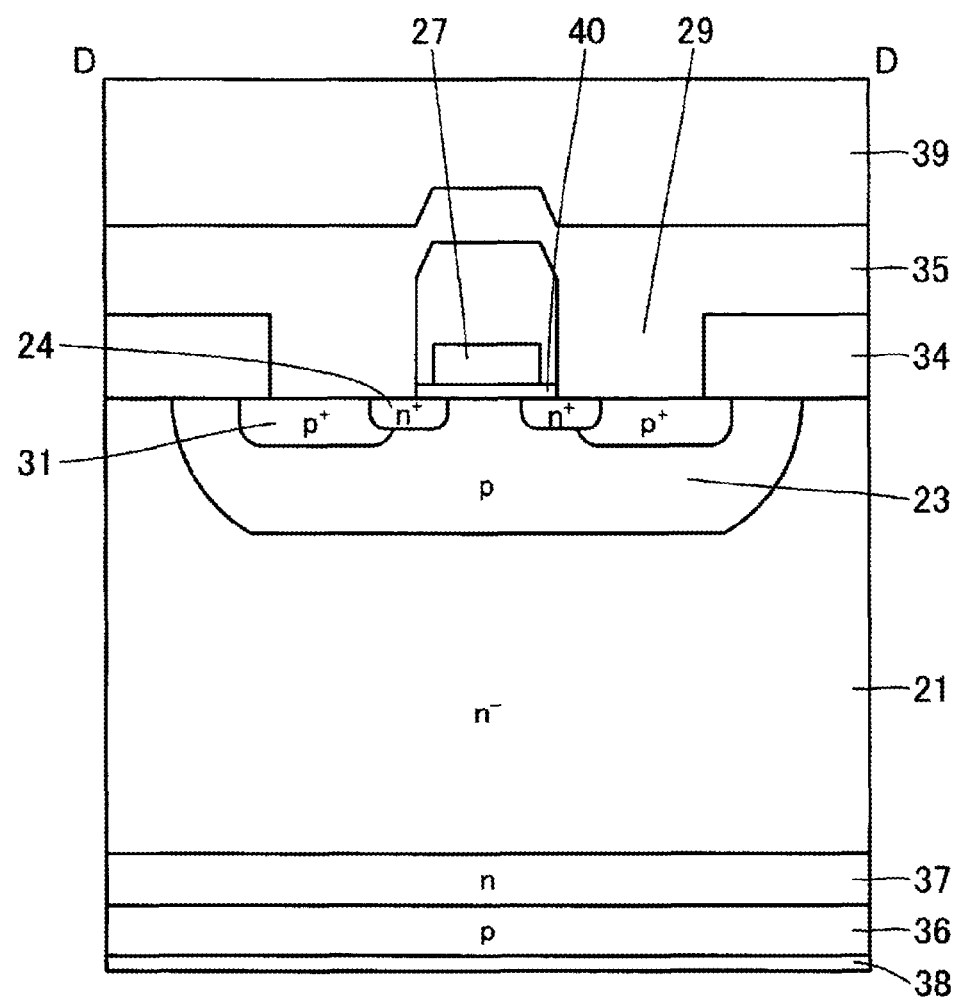
FIG. 4 is a sectional view showing Working Example 1 of the semiconductor device according to the embodiment.

FIG. 1 is a plan layout diagram showing Working Example 1 of a semiconductor device according to an embodiment. A gate insulating film, an interlayer insulating film, an emitter electrode, and a passivation film are omitted from FIG. 1. FIG. 2 is a sectional view along a section line B-B in FIG. 1. The section line B-B follows a first gate insulating film of a trench side wall. FIG. 3 is a sectional view along a section line C-C in FIG. 1. The section line C-C follows a second gate electrode and a conductive region. FIG. 4 is a sectional view along a section line D-D in FIG. 1. The section line D-D intersects the second gate electrode and an emitter cell.

In the semiconductor device of Working Example 1, plural island-form emitter cells (cells) 22 are provided, distanced from each other, on a first main surface of an n⁻ layer 21, as shown in FIG. 1. The n⁻ layer 21 (first conductivity type semiconductor layer) may be, for example, one portion of an n-type semiconductor substrate. A p-base region (second conductivity type semiconductor region) 23 and an n⁺ emitter region (first conductivity type semiconductor region) 24 are provided in the emitter cell 22. Also, as in the example in the drawing, a p⁺ region 31 may also be provided in the p-base region 23. The p⁺ region 31 is provided distanced from a trench 25.

The trench 25 is formed on either side of the emitter cell 22. The n⁺ emitter region 24 is in contact with a side wall of the trench 25 in contact with the emitter cell 22. The plural trench 25 are disposed aligned in a direction intersecting with the longitudinal direction of the trench 25. Plural trench groups 32, each formed of the plural trench 25 disposed aligned in this way, are provided. The trench groups 32 are disposed, distanced from each other, in the longitudinal direction of the trench 25. In the trench group 32, the emitter cell 22 is disposed in, for example, every other one of plural regions sandwiched by neighboring trenches 25. Of the plural regions sandwiched by neighboring trenches 25, regions in which the emitter cell 22 is not disposed form the n⁻ layer 21. In neighboring trench groups 32, the emitter cells 22 are disposed alternately. That is, the repetition cycle of the emitter cell 22 and n⁻ layer 21 in a certain trench group 32 and the repetition cycle of the emitter cell 22 and n⁻ layer 21 in the trench group 32 neighboring this trench group 32 are a half cycle out of alignment.

A first gate electrode (first electrode) 26 is embedded in the trench 25 across the first gate insulating film (first insulating film, omitted from the drawing). A second gate electrode (second electrode) 27 is provided across a second gate insulating film (second insulating film, not appearing in the drawing) on the surface of a region of the p-base region 23 sandwiched by the n⁺ emitter region 24. The second gate electrode 27 electrically connects the first gate electrodes 26 in the trenches 25 on either side of the emitter cell 22. A conductive region 28 is provided across a third gate insulating film (third insulating film, not appearing in the drawing) on the surface of a region of the n⁻ layer 21 sandwiched by neighboring trenches 25. The conductive region 28 electrically connects second gate electrodes 27. The second gate electrode 27 and conductive region 28 also act as wires that transmit a gate signal. The first gate electrode 26, second gate electrode 27, and conductive region 28 may be formed of, for example, doped polysilicon. The first gate insulating film, second gate insulating film, and third gate insulating film may be formed of, for example, an oxide film.

A contact region 29 is in contact with the n+ emitter region 24 and p+ region 31. The n+ emitter region 24 and p-base region 23 are short circuited by the contact region 29. The contact region 29 is isolated from the second gate electrode 27 by an interlayer insulating film omitted from the drawing.

In neighboring trench groups 32, the emitter cells 22 of one trench group 32 and the emitter cells 22 of the other trench group 32 are distanced by a distance L in the longitudinal direction of the trench 25. In neighboring trench groups 32, the second gate electrodes 27 and conductive regions 28 of one trench group 32 and the second gate electrodes 27 and conductive regions 28 of the other trench group 32 are distanced by a distance W/2 in the longitudinal direction of the trench 25. In neighboring trench groups 32, a rectangular region (a region bounded by a two-dot chain line in FIG. 1) bounded by the central point of a certain second gate electrode 27 and the central point of the neighboring conductive region 28 of one trench group 32, and the central point of the second gate electrode 27 and the central point of the conductive region 28 of the other trench group 32, indicates an active portion unit cell 33. Consequently, the dimension of the active portion unit cell 33 in the longitudinal direction of the trench 25 is W/2.

Figure 20:
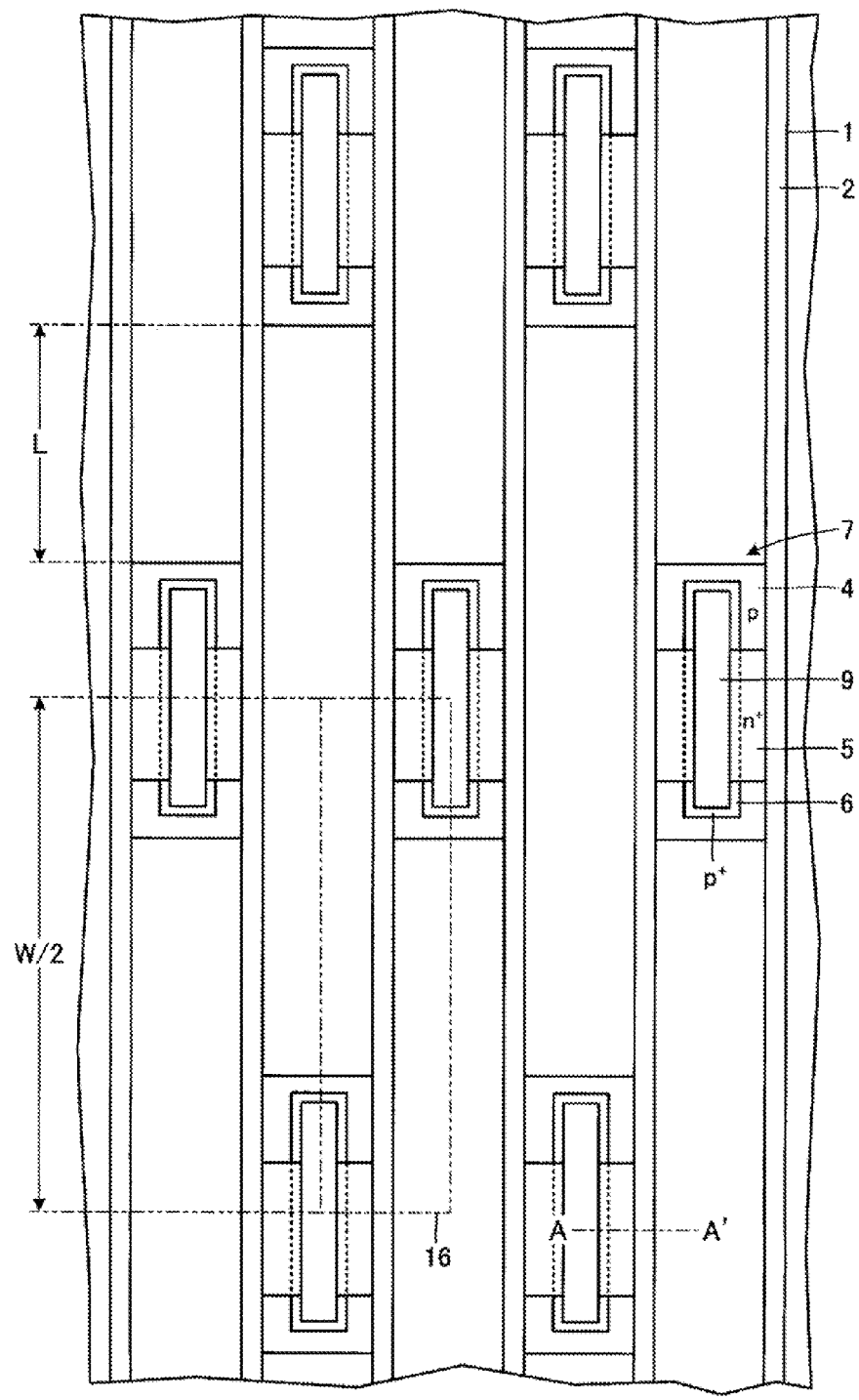
FIG. 20 is a plan layout diagram showing a heretofore known semiconductor device.
Figure 21:
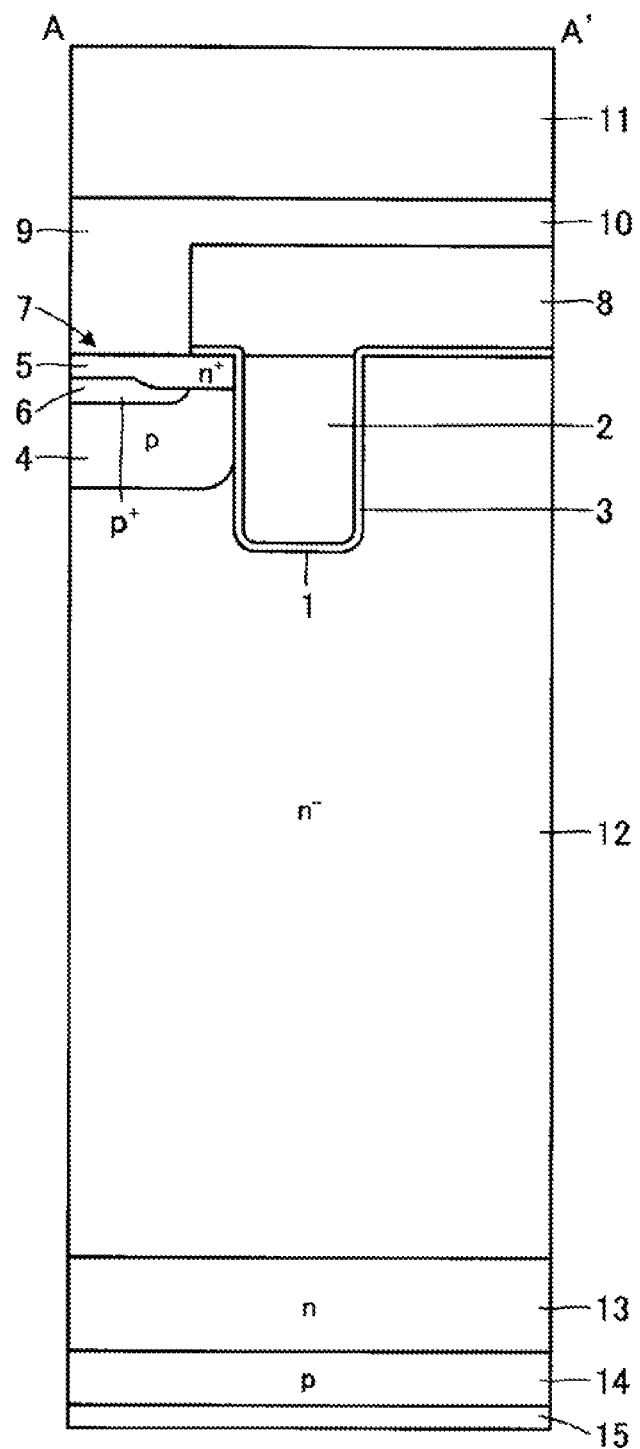
FIG. 21 is a sectional view showing the heretofore known semiconductor device.
Figure 22:
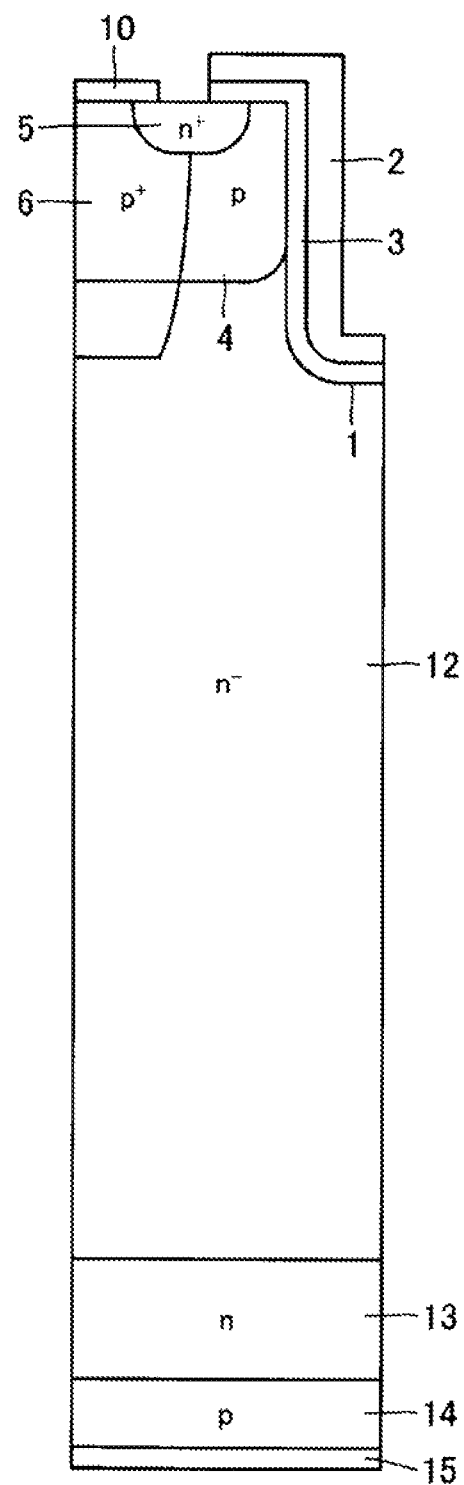
FIG. 22 is a sectional view showing the heretofore known semiconductor device.

Although L and W are also used in a description of a microcell structure IGBT shown in FIG. 20, this does not mean that the value of L and the value of W in Working Example 1 are the same as the value of L and the value of W respectively in the microcell structure IGBT shown in FIG. 20. That is, the value of L and the value of W in Working Example 1 may be the same as, or may differ from, the value of L and the value of W respectively in the microcell structure IGBT shown in FIG. 20. By adjusting the value of L, it is possible to obtain a breakdown voltage equivalent to that of the microcell structure IGBT shown in FIG. 20. In the plan layout shown in FIG. 1, the emitter cell 22 may be provided in a region closed off by a trench 25 of, for example, a loop plan form, wherein trenches 25 sandwiching the emitter cell 22 are connected.

As shown in FIG. 2 to FIG. 4, a first main surface (the main surface on the same side as the first main surface of the n− layer 21) of the semiconductor device is covered with an interlayer insulating film 34. An emitter electrode (third electrode) 35 is provided on the interlayer insulating film 34. The emitter electrode 35 is electrically connected to the contact region 29 penetrating the interlayer insulating film 34. That is, the emitter electrode 35 is electrically connected to the n+ emitter region 24 and p+ region 31 via the contact region 29.

A p-collector layer (second conductivity type semiconductor layer) 36 is provided on a second main surface of the semiconductor device. Also, as in the example in the drawing, an n-buffer layer or n-field stop layer (collectively referred to as an n-buffer layer 37), with resistivity lower than that of the n− layer 21, may also be provided between the p-collector layer 36 and n− layer 21. Although there are also cases in which no n-buffer layer 37 is provided, a description will be given here assuming that the n-buffer layer 37 is provided. A collector electrode (fourth electrode) 38 is electrically connected to the p-collector layer 36. The semiconductor device is covered with a passivation film 39 provided as the uppermost layer on the first main surface of the semiconductor device.

As shown in FIG. 2 and FIG. 4, the n+ emitter region 24 is formed in such a way as to be self-aligning with respect to the second gate electrode 27. A second gate insulating film 40 is provided between the second gate electrode 27 and p-base region 23. In the p-base region 23, the p+ region 31 is provided adjacent to the n+ emitter region 24.

As shown in FIG. 3, a first gate insulating film 41 is provided along the side walls and bottom surface of the trench 25. In the trench 25, a region on the inner side of the first gate insulating film 41 is filled with the first gate electrode 26. A third gate insulating film 42 is provided between the conductive region 28 and n− layer 21. The p-base region 23 is shallower than the trench 25. Also, when forming the first gate electrode 26, second gate electrode 27, and conductive region 28 after forming the p-base region 23 on the semiconductor substrate using an ion injection and thermal diffusion of a p-type impurity such as boron ions, the depth of the p-base region 23 is even. Alternatively, the first gate electrode 26, second gate electrode 27, and conductive region 28 may be formed first, a p-type impurity ion injected into the semiconductor substrate in such a way as to be self-aligning with respect to the first gate electrode 26, second gate electrode 27, and conductive region 28, and thermal diffusion carried out.

Figure 5:
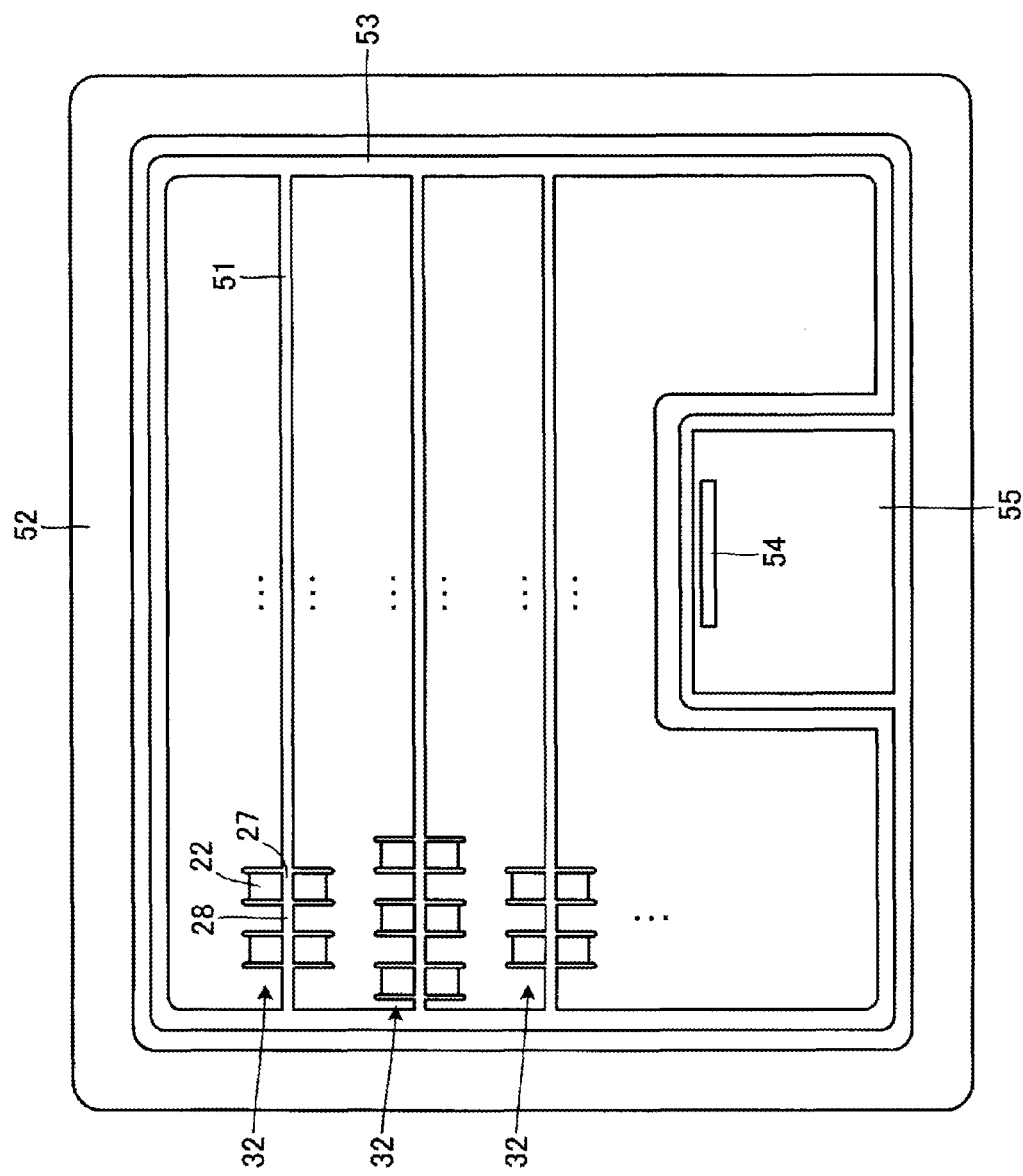
FIG. 5 is a chip layout diagram showing Working Example 1 of the semiconductor device according to the embodiment.

FIG. 5 is a chip layout diagram showing Working Example 1 of the semiconductor device according to the embodiment. As shown in FIG. 5, the second gate electrode 27 and conductive region 28 also act as a gate signal wire 51 in each trench group 32. The gate signal wire 51 is electrically connected to a gate pad 55 via a gate signal wire 53, provided on the inner side of a chip outer peripheral portion termination structure portion 52, and a contact region 54. Although omitted from the drawing, an emitter pad is provided in a region surrounded by the termination structure portion 52 in such a way as to cover a region excluding the gate pad 55.

In the semiconductor device of Working Example 1, the capacitance of each portion that newly becomes mirror capacitance when compared with the heretofore known microcell structure IGBT shown in FIG. 20 is as follows. A capacitance $C_s$ of the third gate insulating film 42 between the conductive region 28 and n− layer 21 is expressed by the following Expression (2). Note that, in Expression (2), $W_{Mesa}$ is the width of a mesa portion between trenches, while $2L_{Gate}$ is the length in the longitudinal direction of the trench 25 of the second gate insulating film 40 and third gate insulating film 42. Herein, although not particularly limited, it is assumed that the dimension in the longitudinal direction of the trench 25 is the same for the second gate insulating film 40 and third gate insulating film 42.

(Expression 2)

$$C_s = (2W_{Mesa}L_{Gate})\varepsilon_0 \frac{\varepsilon_r}{t_{ox}} \qquad (2)$$

In a region on the lower side of the second gate electrode 27 and conductive region 28, a capacitance $C_{sidewall}$ of the first gate insulating film 41 on the trench side wall between the first gate electrode 26 and the n− layer 21 on the side opposite the p-base region 23 is expressed by the following Expression (3).

(Expression 3)

$$C_{sidewall} = (2D_{Trench}L_{Gate})\varepsilon_0 \frac{\varepsilon_r}{t_{ox}} \qquad (3)$$

In the region on the lower side of the second gate electrode 27 and conductive region 28, a capacitance $C_{bottom}$ of the first gate insulating film 41 on the trench bottom between the first gate electrode 26 and n⁻ layer 21 is expressed by the following Expression (4).

(Expression 4)

$$C_{bottom} = (2(W_{Trench} - 2t_{ox})L_{Gate})\varepsilon_0 \frac{\varepsilon_r}{t_{ox}} \quad (4)$$

A capacitance $C_{Trench\_end}$ of the first gate insulating film 41 at a trench end between the first gate electrode 26 and n⁻ layer 21 is expressed by the following Expression (5).

(Expression 5)

$$C_{Trench\_end} \approx 2(W_{Trench} - 2t_{ox})D_{Trench}\varepsilon_0 \frac{\varepsilon_r}{t_{ox}} \quad (5)$$

When comparing the semiconductor device of Working Example 1 and the heretofore known microcell structure IGBT shown in FIG. 20, the capacitances expressed by Expression (2) to Expression (5) become new mirror capacitance. However, when comparing by unit cell unit, the mirror capacitance of the semiconductor device of Working Example 1 is smaller than a mirror capacitance $C_{ex}$ (refer to Expression (1)) of the heretofore known microcell structure IGBT shown in FIG. 20. The mirror capacitance of the semiconductor device of Working Example 1 decreases with respect to the mirror capacitance of the heretofore known microcell structure IGBT shown in FIG. 20 by the amount of a mirror capacitance $C_{reduced}$ expressed by the following Expression (6).

(Expression 6)

$$\begin{aligned}C_{reduced} &= C_{ex} - C_s - C_{sidewall} - C_{bottom} - C_{Trench\_end} \quad (6)\\ &= [(W_{Trench}L + 2LD_{Trench}) - 2W_{Mesa}L_{Gate} -\\ &\quad 2D_{Trench}L_{Gate} - 2(W_{Trench} - 2t_{ox})L_{Gate} -\\ &\quad 2(W_{Trench} - 2t_{ox})D_{Trench}]\varepsilon_0 \frac{\varepsilon_r}{t_{ox}}\end{aligned}$$

Next, a description will be given, with examples, of advantages of reducing the mirror capacitance in the semiconductor device of Working Example 1. In the semiconductor device of Working Example 1, the value of W when the dimension in the longitudinal direction of the trench 25 of the active portion unit cell 33 is W/2 is taken to be 31.6 μm. The value of a depth $D_{Trench}$ of the trench 25 is taken to be 5 μm. The value of a width $W_{Trench}$ of the trench 25 is taken to be 1.4 μm. The value of $L_{Gate}$ when the length in the longitudinal direction of the trench 25 of the second gate insulating film 40 and third gate insulating film 42 is $2L_{Gate}$ is taken to be 1 μm. The value of the width $W_{Mesa}$ of the mesa portion between trenches is taken to be 2.2 μm. The value of a width $W_{pbase}$ of the p-base region 23 is taken to be 10 μm. The depth of the p-base region 23 is taken to be 2.5 μm. The value of a thickness $t_{ox}$ of the first gate insulating film 41, second gate insulating film 40, and third gate insulating film 42 is taken to be 0.1 μm. The gate oxide film is taken to be $SiO_2$.

When calculating the mirror capacitance of each portion of the semiconductor device of Working Example 1 under these conditions, the results are as follows. The unit of size of each capacitance is taken to be $\varepsilon_0 \times \varepsilon_r / t_{ox} = 345.2$ μF. The value of $C_s$ is 4.4 units. The value of $C_{sidewall}$ is 10 units. The value of $C_{bottom}$ is 2.4 units. The value of $C_{Trench\_end}$ is 12 units. The value of a capacitance $C_{gc'\ sidewall1}$ of a region, excluding the region of $C_{sidewall}$, of the first gate insulating film 41 on the trench side wall between the first gate electrode 26 and n⁻ layer 21 is 70 units. The value of a capacitance $C_{gc'\ bottom}$ of a region, excluding the region of $C_{bottom}$, of the first gate insulating film 41 on the trench bottom between the first gate electrode 26 and n⁻ layer 21 is 16.8 units. The value of a capacitance $C_{gc'\ sidewall2}$ of a region on the p-base region 23 side of the first gate insulating film 41 on the trench side wall between the first gate electrode 26 and n⁻ layer 21 is 40 units.

Consequently, the value of an overall mirror capacitance $C_{gc}$ of the semiconductor device of Working Example 1, wherein these values are added together, is 155.6 units. Also, the value of an on-current $I_{on}$ per active portion unit cell 33 when the value of a collector-emitter voltage $V_{ce}$ is 2.0 V at a temperature of 425 K is $1.782 \times 10^{-4}$ A.

As a comparison, the heretofore known microcell structure IGBT shown in FIG. 20 is taken as a heretofore known example. In a semiconductor device of the heretofore known example, the distance L between emitter cells 7 disposed one on either side of one trench 1 is taken to be 8 μm. The value of W when the dimension in the longitudinal direction of the trench 1 of an active portion unit cell 16 is W/2 is taken to be 39.6 μm. The value of the depth $D_{Trench}$ of the trench 1 is taken to be 5 μm. The value of the width $W_{Trench}$ of the trench 1 is taken to be 1.4 μm. The value of the width $W_{Mesa}$ of the mesa portion between trenches is taken to be 2.2 μm. The value of the width $W_{pbase}$ of a p-base region 4 is taken to be 8 μm. The value of the thickness $t_0$ of a gate insulating film 3 is taken to be 0.1 μm.

When calculating the mirror capacitance of each portion of the semiconductor device of the heretofore known example under these conditions, the results are as follows. The value of $C_{ex}$ is 91.2 units. The value of the capacitance $C_{gc'\ sidewall1}$ of the gate insulating film 3 on a trench side wall between a gate electrode 2 and an n⁻ layer 12 on the side opposite the p-base region 4 is 70 units. The value of the capacitance $C_{gc'\ bottom}$ of the gate insulating film 3 on the trench bottom between the gate electrode 2 and n⁻ layer 12 is 16.8 units. The value of the capacitance $C_{gc'\ sidewall2}$ of a region on the p-base region 4 side of the gate insulating film 3 on a trench side wall between the gate electrode 2 and n⁻ layer 12 is 35 units.

Consequently, the value of the overall mirror capacitance $C_{gc}$ of the semiconductor device of the heretofore known example, wherein these values are added together, is 213 units. Also, the value of the on-current $I_{on}$ per active portion unit cell 16 when the value of the collector-emitter voltage $V_{ce}$ is 2.0 V at a temperature of 425 K is $1.780 \times 10^{-4}$ A.

When comparing the overall mirror capacitance of the semiconductor device of Working Example 1 and that of the semiconductor device of the heretofore known example, based on the heretofore described calculation results, the mirror capacitance of the semiconductor device of Working Example 1 decreases by 27% per active portion unit cell with respect to that of the heretofore known example. When there is no limit on current density scaling, the mirror capacitance of the semiconductor device of Working Example 1 decreases by 27% with respect to that of the heretofore known example. When it is necessary to keep the operating current density of the element constant, the mirror capacitance of the semiconductor device of Working Example 1 decreases by 22% with respect to that of the heretofore known example. This is because, as the active area of the semiconductor device of Working Example 1 is the same as that in the semiconductor device of the heretofore known example when keeping the operating current density of the element constant, the number of unit cells in the semiconductor device of Working Example 1 increases in inverse proportion to unit length. With regard to the semiconductor device of Working Example 1, the number of unit cells when keeping the operating current density of the element constant is a value wherein the number of unit cells when there is no limit on current density scaling is multiplied by the value of W (39.6 μm) of the semiconductor device of the heretofore known example, and divided by the value of W (31.6 μm) of the semiconductor device of Working Example 1.

Figure 6:
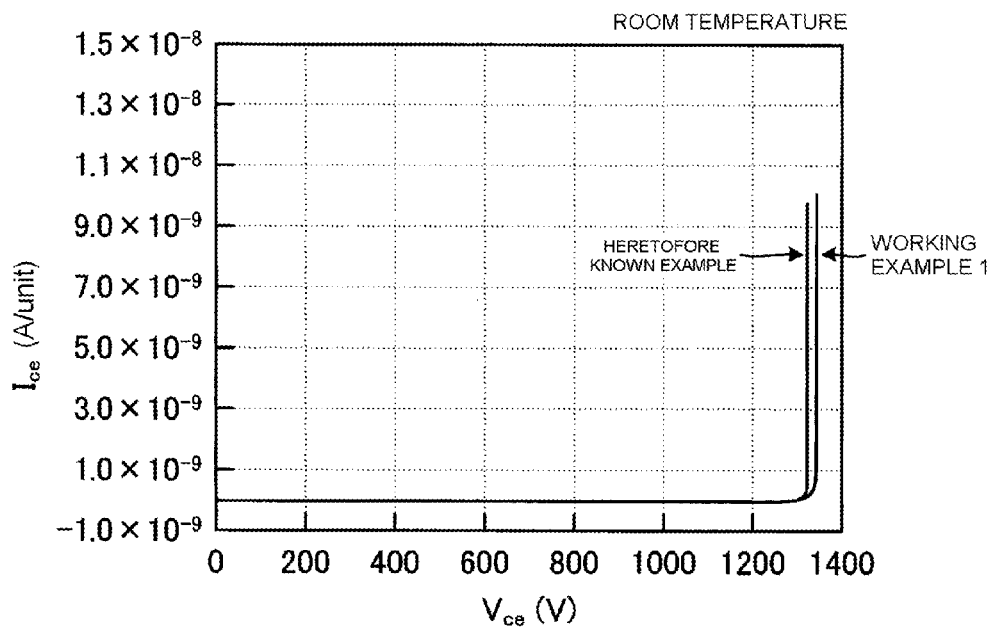
FIG. 6 is a characteristic diagram showing simulation results for $I_{ce}$-$V_{ce}$ characteristics of Working Example 1.
Figure 7:
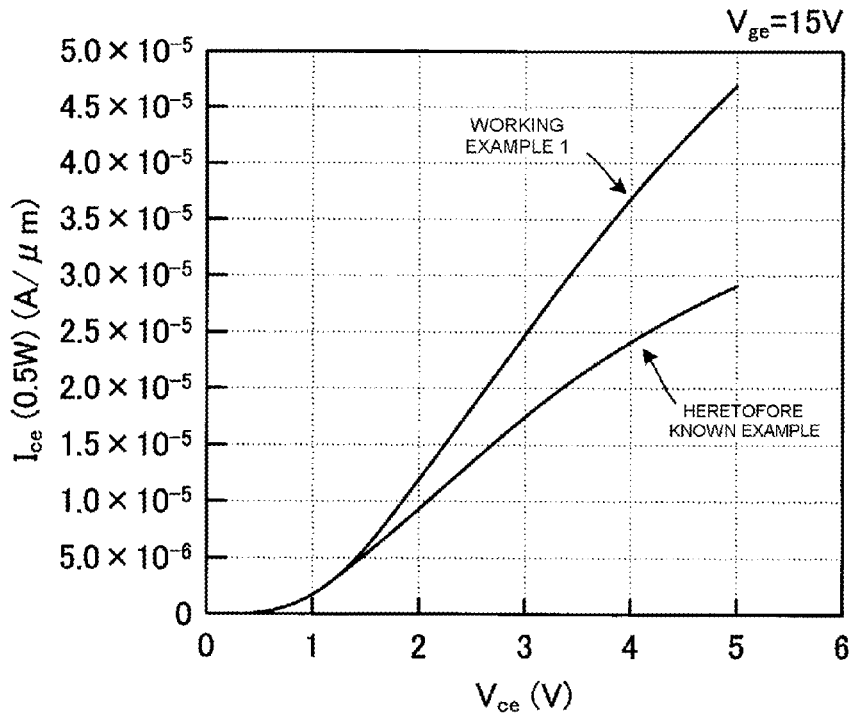
FIG. 7 is a characteristic diagram showing simulation results for $I_{ce}$-$V_{ce}$ characteristics of Working Example 1.

FIG. 6 and FIG. 7 are characteristic diagrams showing simulation results for $I_{ce}$-$V_{ce}$ characteristics of the semiconductor device of Working Example 1 and the semiconductor device of the heretofore known example. $I_{ce}$ is the collector-emitter current. The simulation results shown in FIG. 6 are results in an off-condition at room temperature. From FIG. 6, it can be seen that the semiconductor device of Working Example 1 has a breakdown voltage equivalent to, or larger than, that of the semiconductor device of the heretofore known example. The simulation results shown in FIG. 7 are results when the value of a gate-emitter voltage $V_{ge}$ is 15 V at a temperature of 425 K. From FIG. 7, it can be seen that the semiconductor device of Working Example 1 has a saturation current density higher than that of the semiconductor device of the heretofore known example. When it is necessary, in the semiconductor device of Working Example 1, to limit the saturation current density owing to a relationship with a short circuit capability SCSOA (short circuit safe operating area), or the like, it is sufficient to reduce the saturation current density to an extent that it is possible to maintain an on-current density equivalent to that of the semiconductor device of the heretofore known example (for example, a current density when $V_{ce}$=2.0 V, and $V_{ge}$=15 V). In order to reduce the saturation current density in the semiconductor device of Working Example 1, it is sufficient to reduce the length in the longitudinal direction of the trench 25 of the n$^+$ emitter region 24, reduce the value of $L_{Gate}$, and reduce the value of $W_{pbase}$ in accordance with these.

The simulation results shown in FIG. 6 and FIG. 7 are obtained under the following conditions. In the emitter cells 22 and 7 of the semiconductor device of Working Example 1 and semiconductor device of the heretofore known example, the emitter length in a direction parallel to the trench is taken to be 2.4 μm. The density of the n$^-$ layers 21 and 12 is taken to be 9×10$^{13}$ cm$^{-3}$. A peak density at a depth of 0.2 μm from the collector electrodes 38 and 15 in the p-collector layers 36 and 14 is taken to be 3×10$^{17}$ cm$^{-3}$. A depth Xj of a p-n junction between the p-collector layers 36 and 14 and n-buffer layers 37 and 13 is taken to be 0.8 μm to 0.9 μm. The thickness of the n-buffer layers 37 and 13 is taken to be approximately 30 μm. A peak density of the n-buffer layers 37 and 13 in the vicinity of the depth Xj of the p-n junction with the p-collector layers 36 and 14 is taken to be 2.2×10$^{15}$ cm$^{-3}$. The thickness of the semiconductor substrate is taken to be 115 μm. In order that the value of the on-current $I_{on}$ is 150 A when the value of the gate-emitter voltage $V_{ge}$ is 15 V and the value of $V_{ce}$ is 2.0 V, the number of unit cells is taken to be 8.42×10$^5$. This corresponds to a case in the heretofore described calculation results in which there is no limit on current density scaling.

Figure 8:
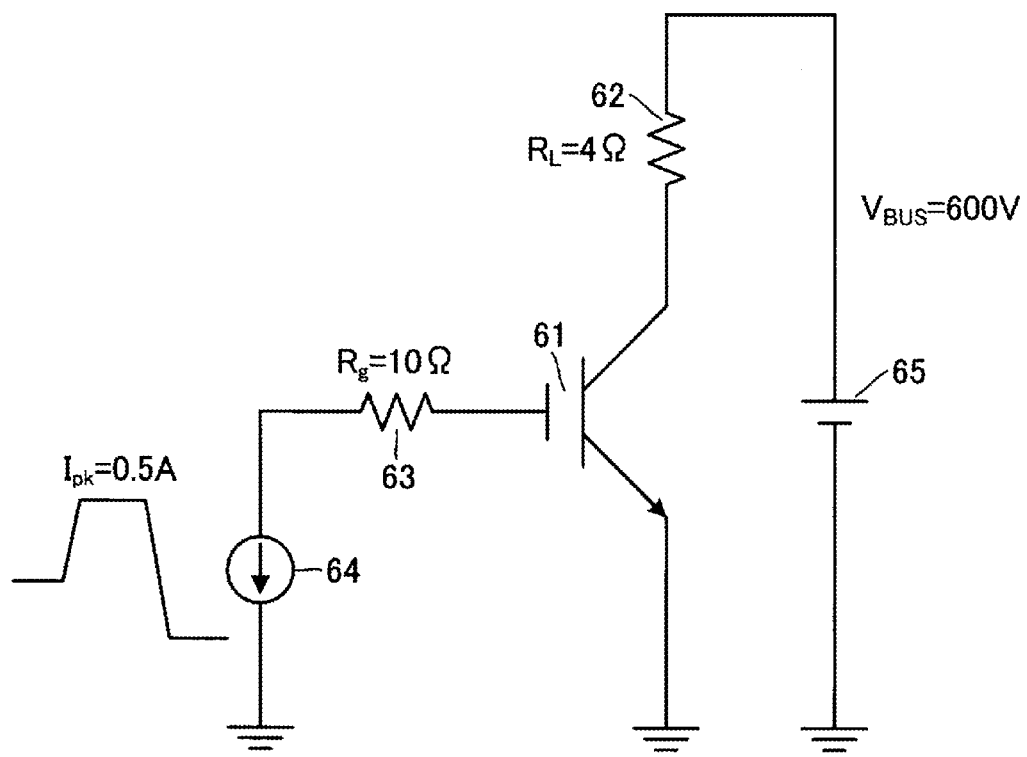
FIG. 8 is a circuit diagram showing an evaluation circuit of a semiconductor device.

Also, with an evaluation circuit wherein a load resistor 62 is connected to a collector of a semiconductor device 61, as shown in FIG. 8, it is possible to evaluate the mirror capacitance of the semiconductor device 61 by simulating a turning on process of the semiconductor device 61. In FIG. 8, reference numeral 63 is a gate resistor, reference numeral 64 is a fixed current source, and reference numeral 65 is a power source. In the evaluation circuit shown in FIG. 8, 600 V is applied as a bus voltage $V_{BUS}$ to the collector of the semiconductor device 61, and the value of a load resistance $R_L$ is taken to be approximately 4Ω. The value of a gate resistance $R_g$ is taken to be 10Ω, and the value of a peak current $I_{pk}$ of the fixed current source 64 is taken to be 0.5 A. Under these conditions, taking the semiconductor device of Working Example 1 and the semiconductor device of the heretofore known example to be of a 120 A class, it is possible to evaluate the mirror capacitance by simulating the turning on process at a temperature of 425 K.

Figure 9:
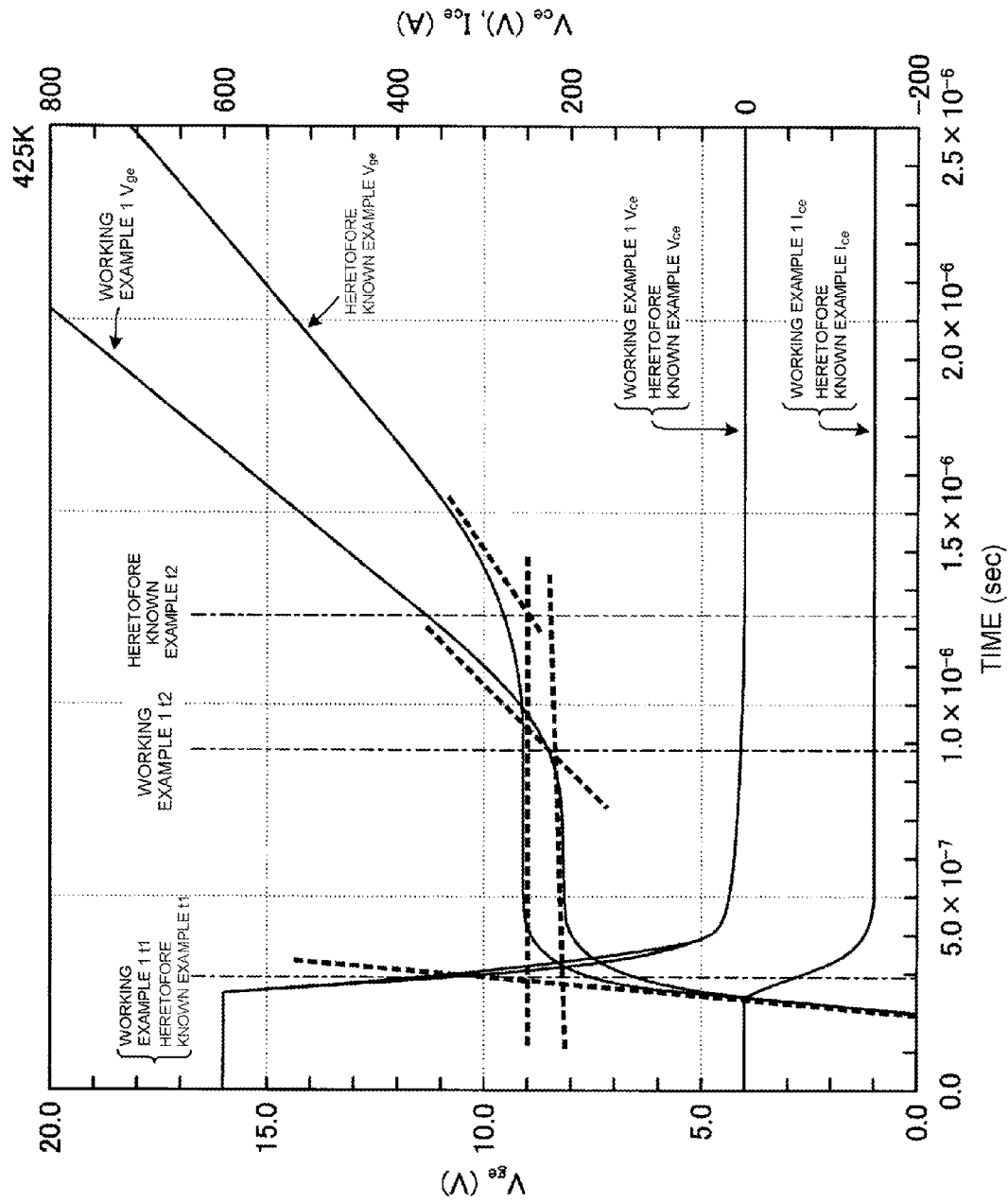
FIG. 9 is a characteristic diagram showing results of simulating a turning on process of Working Example 1.

FIG. 9 is a characteristic diagram showing results of simulating the turning on process of the semiconductor device of Working Example 1 and the semiconductor device of the heretofore known example. In the characteristic diagram shown in FIG. 9, as shown by straight broken lines in the same drawing, it is possible to calculate a starting time t1 and finishing time t2 of a plateau period of the gate-emitter voltage $V_{ge}$ by extrapolating a characteristic curve of the gate-emitter voltage $V_{ge}$. It is possible to calculate the plateau period of the gate-emitter voltage $V_{ge}$ by subtracting the starting time t1 from the finishing time t2. The length of the plateau period of the gate-emitter voltage $V_{ge}$ depends on the size of the mirror capacitance. When the mirror capacitance increases, the plateau period of the gate-emitter voltage $V_{ge}$ lengthens. Consequently, it is possible to evaluate the size of the mirror capacitance by calculating the plateau period of the gate-emitter voltage $V_{ge}$.

As shown in FIG. 9, for the semiconductor device of Working Example 1, the starting time t1 of the plateau period of the gate-emitter voltage $V_{ge}$ is 3.00×10$^{-7}$ seconds, while the finishing time t2 of the plateau period of the gate-emitter voltage $V_{ge}$ is 9.00×10$^{-7}$ seconds. Consequently, the plateau period of the gate-emitter voltage $V_{ge}$ is 6.00×10$^{-7}$ seconds. For the semiconductor device of the heretofore known example, the starting time t1 of the plateau period of the gate-emitter voltage $V_{ge}$ is 3.00×10$^{-7}$ seconds, while the finishing time t2 of the plateau period of the gate-emitter voltage $V_{ge}$ is 1.22×10$^{-6}$ seconds. Consequently, the plateau period of the gate-emitter voltage $V_{ge}$ is 9.20×10$^{-7}$ seconds. From these results, the mirror capacitance of the semiconductor device of Working Example 1 decreases by 34.78% with respect to that of the heretofore known example.

As the active area of the semiconductor device of Working Example 1 is the same as that of the semiconductor device of the heretofore known example when it is necessary to keep the operating current density of the element constant, the number of unit cells of the semiconductor device of Working Example 1 increases, as heretofore described. The mirror capacitance reduction rate decreases by an amount equivalent to the increase in the number of unit cells. When using the value of W (31.6 μm) of the semiconductor device of Working Example 1 and the value of W (39.6 μm) of the semiconductor device of the heretofore known example, the mirror capacitance of the semiconductor device of Working Example 1 decreases by 27.75% (=34.78%/(39.6 μm/31.6 μm)) with respect to that of the heretofore known example.

WORKING EXAMPLE 2

Figure 10:
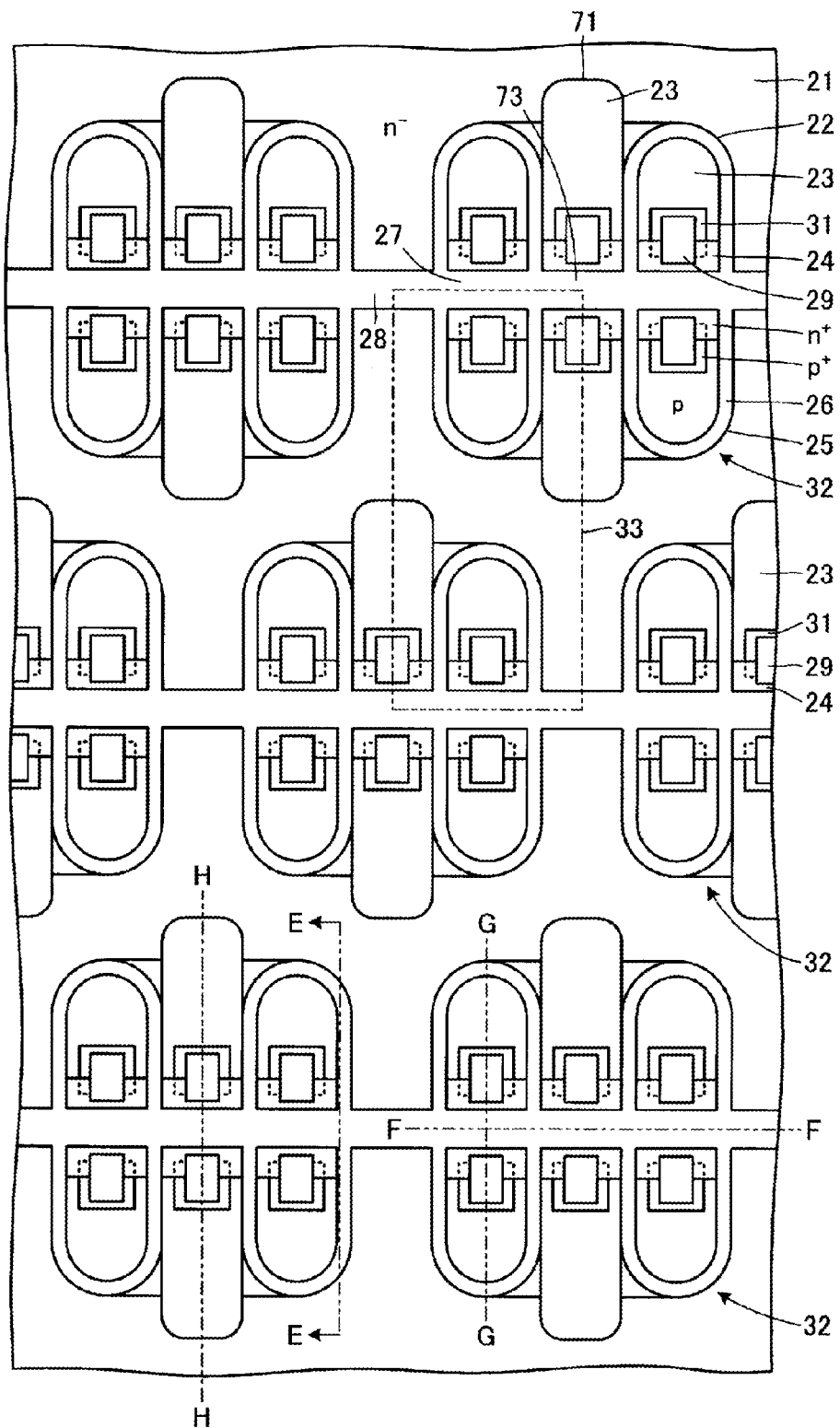
FIG. 10 is a plan layout diagram showing Working Example 2 of the semiconductor device according to the embodiment.
Figure 11:
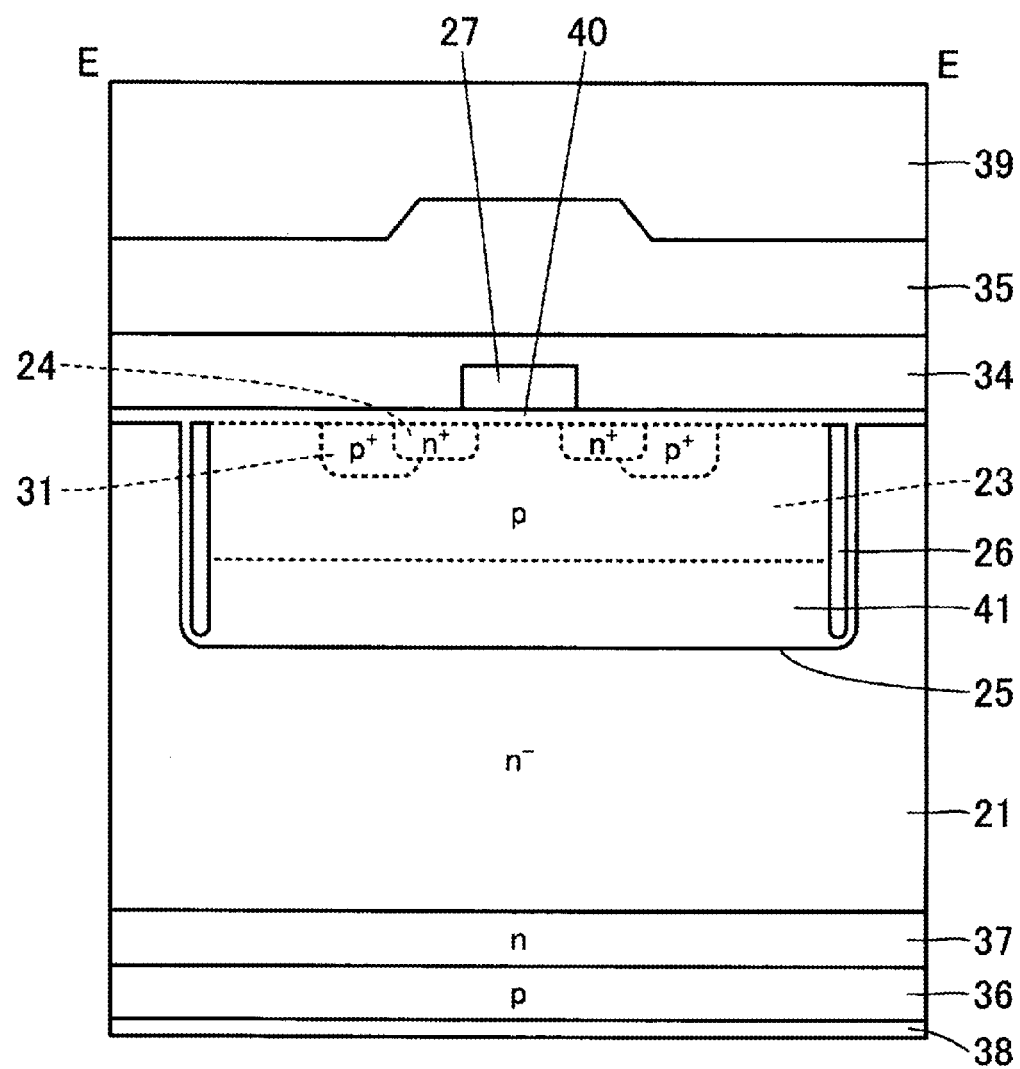
FIG. 11 is a sectional view showing Working Example 2 of the semiconductor device according to the embodiment.
Figure 12:
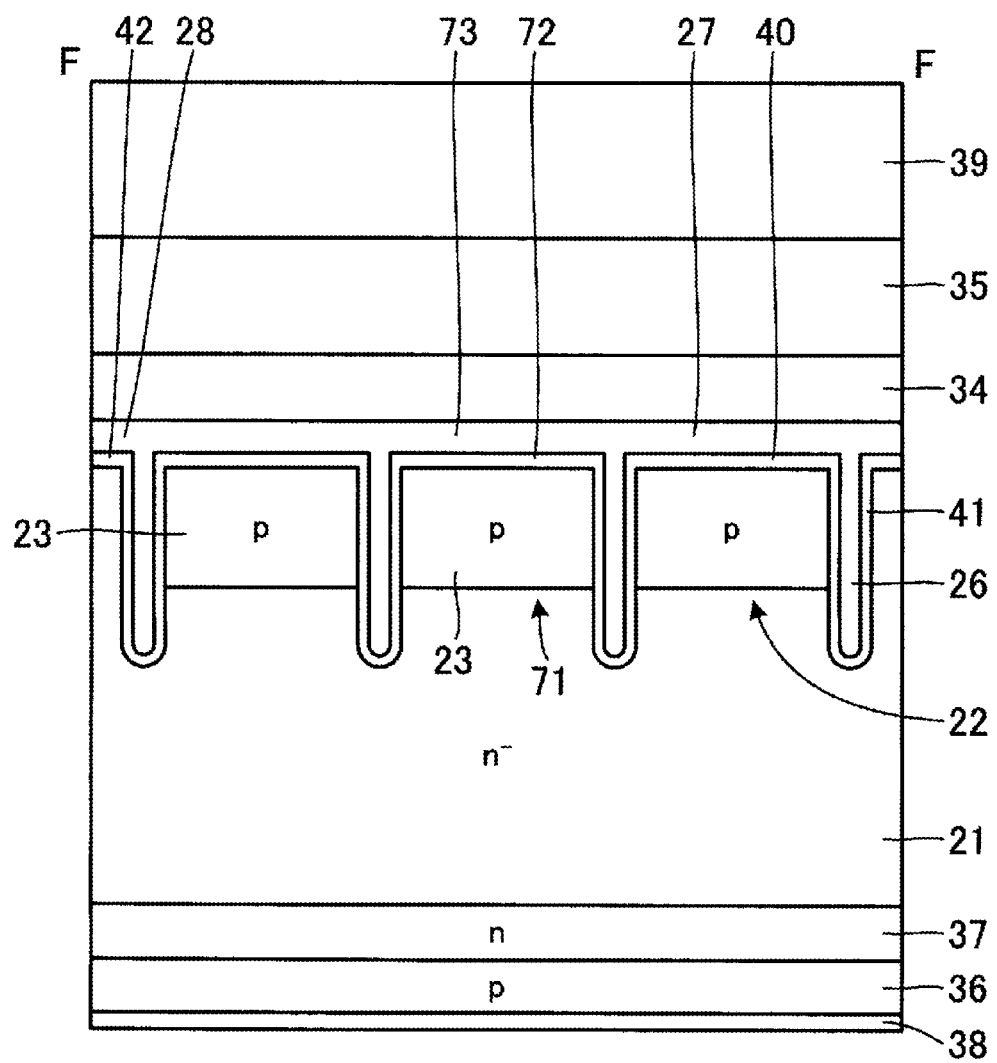
FIG. 12 is a sectional view showing Working Example 2 of the semiconductor device according to the embodiment.
Figure 13:
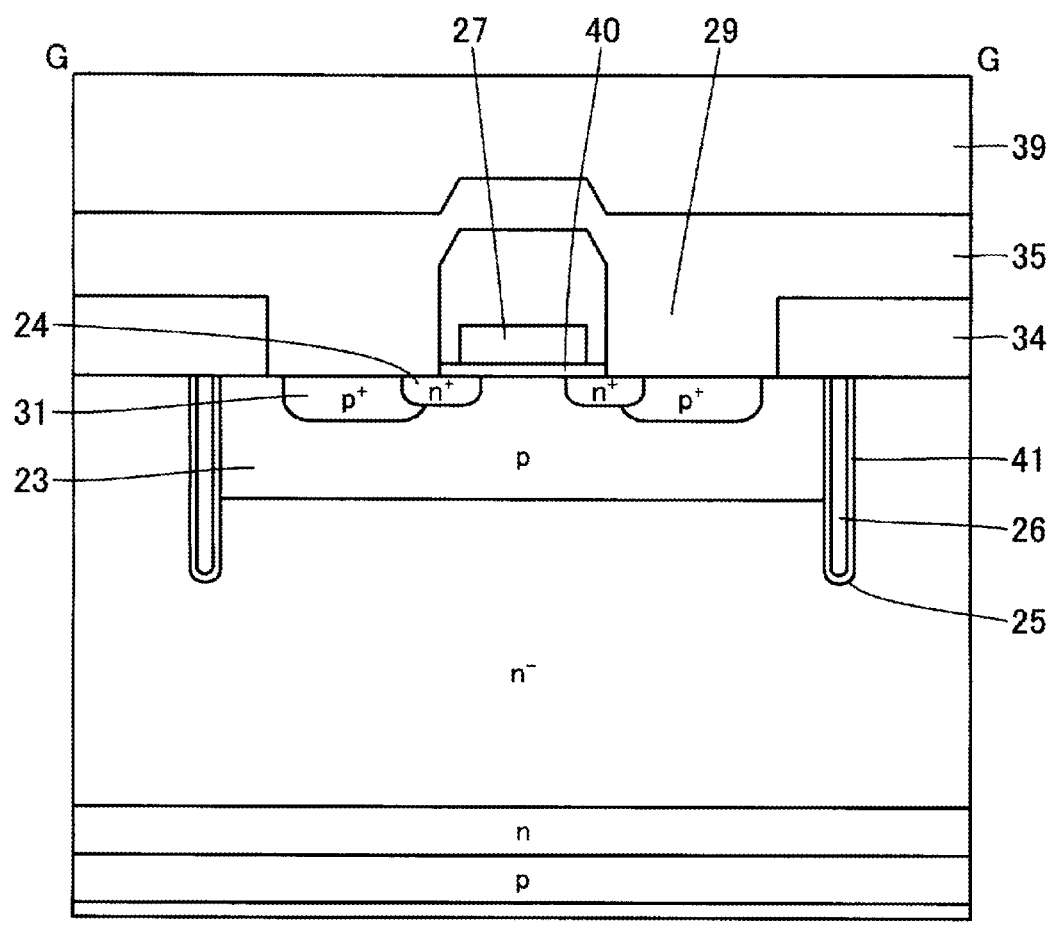
FIG. 13 is a sectional view showing Working Example 2 of the semiconductor device according to the embodiment.

FIG. 10 is a plan layout diagram showing Working Example 2 of the semiconductor device according to the embodiment. A gate insulating film, an interlayer insulating film, an emitter electrode, and a passivation film are omitted from FIG. 10. FIG. 11 is a sectional view along a section line E-E in FIG. 10. The section line E-E follows a first gate insulating film of a trench side wall. FIG. 12 is a sectional view along a section line F-F in FIG. 10. The section line F-F follows a second gate electrode and a conductive region. FIG. 13 is a sectional view along a section line G-G in FIG. 10. The section line G-G intersects a trench, the second gate electrode and an emitter cell.

As shown in FIG. 10 to FIG. 14, the semiconductor device of Working Example 2 differs from the semiconductor device of Working Example 1 in the following points. In the plan layout, trenches 25 sandwiching the emitter cell 22 are connected in such a way that, for example, the plan form is of a loop form. Consequently, the first gate electrode 26 appears in a cross-section along the first gate insulating film 41 on the trench side walls (refer to FIG. 11). The emitter cell 22 is provided in a region closed off by the trench 25 of, for example, a loop form. The trench 25, first gate electrode 26, and first gate insulating film 41 appear in a cross-section intersecting the trench 25, second gate electrode 27, and emitter cell 22, and the p-base region 23 is sandwiched by the trench 25 (refer to FIG. 13).

Also, an emitter cell 71 is also disposed in one portion of regions between neighboring regions closed off by trenches 25. In the example shown in FIG. 10, the emitter cell 71 is disposed in, for example, every other one of plural regions between neighboring regions closed off by trenches 25. In neighboring trench groups 32, the emitter cells 71 are disposed alternately. That is, the repetition cycle of the emitter cell 71 and n⁻ layer 21 in a certain trench group 32 and the repetition cycle of the emitter cell 71 and n⁻ layer 21 in the trench group 32 neighboring this trench group 32 are a half cycle out of alignment.

In the emitter cell 71 disposed between regions closed off by trenches 25, a second gate insulating film 72 is provided on the surface of a region of the p-base region 23 sandwiched by the n⁺ emitter region 24. A second gate electrode 73 is provided on the second gate insulating film 72. The second gate electrode 73 electrically connects first gate electrodes 26, as in Working Example 1.

In the emitter cell 71 disposed between regions closed off by trenches 25, the p-base region 23 extends farther in the longitudinal direction of the trench 25 than the trench 25. Consequently, the emitter cell 71 disposed between regions closed off by trenches 25, the second gate insulating film 72, and the second gate electrode 73 appear in a cross-section along the second gate electrodes 27 and 73 and the conductive area 28 (refer to FIG. 12). A section line H-H of FIG. 10 intersects the second gate electrode 73 and emitter cell 71, without intersecting the trench 25. Although the configuration of a cross-section along the section line H-H is the same as the configuration of the cross-section shown in FIG. 4 of Working Example 1, the second gate electrode 27 and second gate insulating film 40 in FIG. 4 become the second gate electrode 73 and second gate insulating film 72 respectively.

Figure 14:
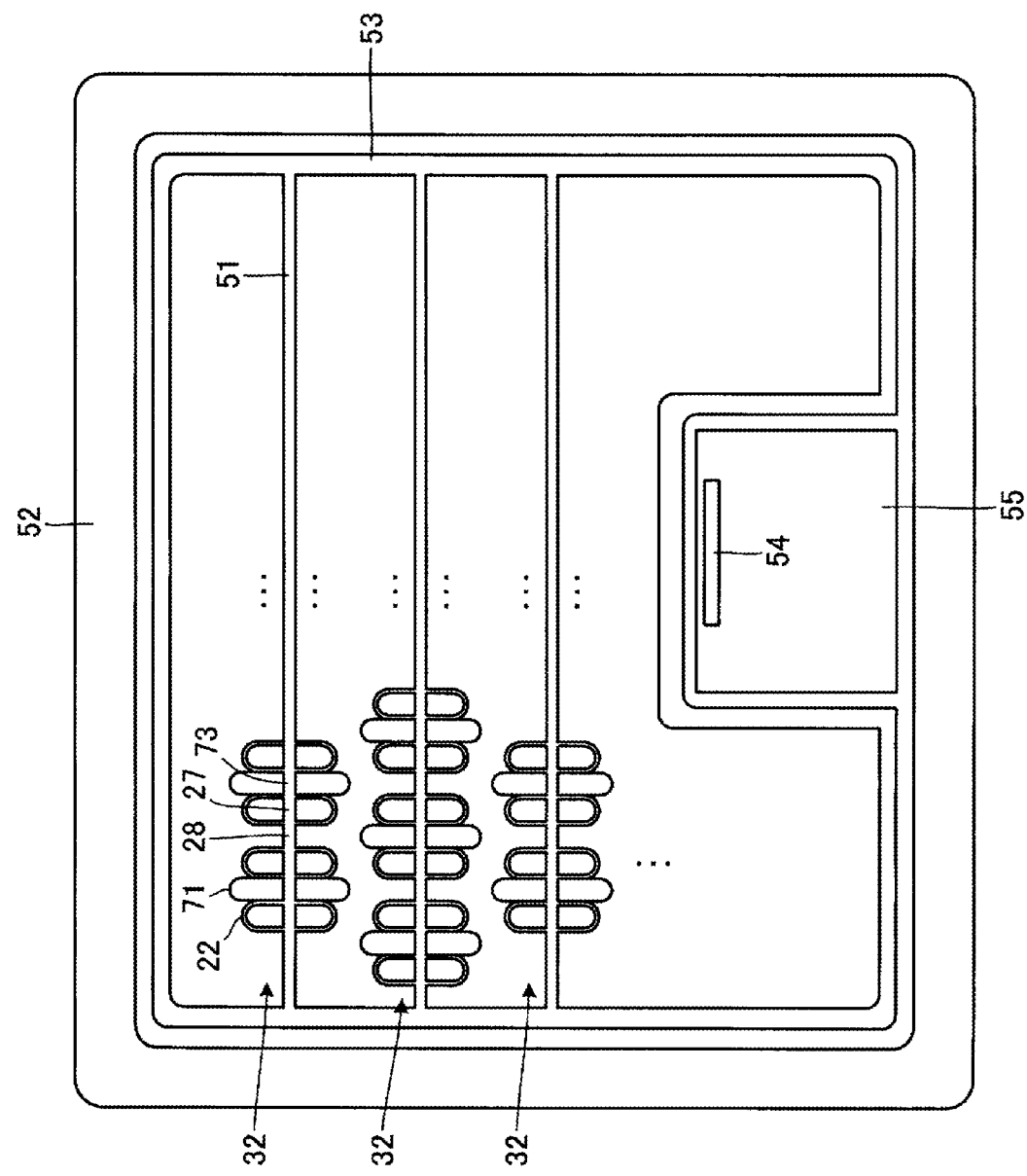
FIG. 14 is a chip layout diagram showing Working Example 2 of the semiconductor device according to the embodiment.

FIG. 14 is a chip layout diagram showing Working Example 2 of the semiconductor device according to the embodiment. As shown in FIG. 14, in Working Example 2, the second gate electrode 73 too, along with the second gate electrode 27 and conductive region 28, acts as the gate signal wire 51 in each trench group 32. Other configurations of the semiconductor device of Working Example 2 are the same as in Working Example 1.

In the semiconductor device of Working Example 2, the capacitance of each portion that newly becomes mirror capacitance when compared with the heretofore known microcell structure IGBT shown in FIG. 20 is as follows. $C_s$, $C_{sidewall}$, and $C_{bottom}$ are expressed by Expression (2), Expression (3), and Expression (4) respectively.

The capacitance $C_{Trench\_end}$ of the first gate insulating film 41 at a trench end between the first gate electrode 26 and n⁻ layer 21 is expressed by the following Expression (7).

(Expression 7)

$$C_{Trench\_end} \approx \pi(W_{Mesa} + W_{Trench})(D_{Trench} + W_{Trench})\varepsilon_0 \frac{\varepsilon_r}{t_{ox}} \quad (7)$$

When comparing the semiconductor device of Working Example 2 and the heretofore known microcell structure IGBT shown in FIG. 20, the capacitances expressed by Expression (2) to Expression (4), and Expression (7), become new mirror capacitance. However, when comparing by unit cell unit, the mirror capacitance of the semiconductor device of Working Example 2 is smaller than the mirror capacitance $C_{ex}$ (refer to Expression (1)) of the heretofore known microcell structure IGBT shown in FIG. 20. The mirror capacitance of the semiconductor device of Working Example 2 decreases with respect to the mirror capacitance of the heretofore known microcell structure IGBT shown in FIG. 20 by the amount of the mirror capacitance $C_{reduced}$ expressed by the following Expression (8).

(Expression 8)

$$\begin{aligned}C_{reduced} = {}& 2C_{ex} - C_s - C_{sidewall} - C_{bottom} - C_{Trench\_end} \\ & [2(W_{Trench}L + 2LD_{Trench}) - 2W_{Mesa}L_{Gate} - \\ & 2D_{Trench}L_{Gate} - 2(W_{Trench} - 2t_{ox})L_{Gate} - \pi \\ & (W_{Trench} + W_{Mesa})(D_{Trench} + W_{Trench})]\varepsilon_0 \frac{\varepsilon_r}{t_{ox}}\end{aligned} \quad (8)$$

Next, a description will be given, with examples, of advantages of reducing the mirror capacitance in the semiconductor device of Working Example 2. In the semiconductor device of Working Example 2, the value of W is taken to be 28 μm. The value of $D_{Trench}$ is taken to be 5 μm. The value of $W_{Trench}$ is taken to be 1.4 μm. The value of $L_{Gate}$ is taken to be 0.8 μm. The value of $W_{Mesa}$ is taken to be 2.2 μm. The value of $W_{pbase}$ is taken to be 10 μm. The value of $t_{ox}$ is taken to be 0.1 μm.

When calculating the mirror capacitance of each portion of the semiconductor device of Working Example 2 under these conditions, the results are as follows. The value of $C_s$ is 3.52 units. The value of $C_{sidewall}$ is 8 units. The value of $C_{bottom}$ is 1.92 units. The value of $C_{Trench\_end}$ is 72.35 units. The value of $C_{gc'sidewall1}$ is 55 units. The value of $C_{gc'bottom}$ is 26.4 units. The value of $C_{gc'sidewall2}$ is 80 units. Consequently, the value of the overall mirror capacitance $C_{gc}$ of the semiconductor device of Working Example 2, wherein these values are added together, is 247.19 units.

As a comparison, the heretofore known microcell structure IGBT shown in FIG. 20 is taken as a heretofore known example. In the semiconductor device of the heretofore known example, the value of L is taken to be 8μ. The value of W is taken to be 39.6 μm. The value of $D_{Trench}$ is taken to be 5 μm. The value of $W_{Trench}$ is taken to be 1.4 μm. The value of $W_{Mesa}$ is taken to be 2.2 μm. The value of $W_{pbase}$ is taken to be 8 μm. The value of $t_{ox}$ is taken to be 0.1 μm.

When calculating the mirror capacitance of each portion of the semiconductor device of the heretofore known example under these conditions, the results are as follows. The value of $C_{ex}$ is 179.2 units. The value of $C_{gc'sidewall1}$ is 55 units. The value of $C_{gc'bottom}$ is 26.4 units. The value of $C_{gc'sidewall2}$ is 70 units. Consequently, the value of the overall mirror capacitance $C_{gc}$ of the semiconductor device of the heretofore known example, wherein these values are added together, is 330.6 units.

When comparing the overall mirror capacitance of the semiconductor device of Working Example 2 and that of the semiconductor device of the heretofore known example, the mirror capacitance of the semiconductor device of Working Example 2 decreases by 25% per active portion unit cell with respect to that of the heretofore known example. When the operating current density of the element is kept constant, the active area of the semiconductor device of Working Example 2 is the same as that of the semiconductor device of the heretofore known example. The mirror capacitance reduction rate in this case is a value wherein the reduction rate (25%) when there is no limit on current density scaling is multiplied by the value of W (28 μm) of the semiconductor device of Working Example 2, and divided by the value of W (39.6 μm) of the semiconductor device of the heretofore known example. That is, when the operating current density of the element is kept constant, the mirror capacitance of the semiconductor device of Working Example 2 decreases by 18% with respect to that of the heretofore known example.

Figure 15:
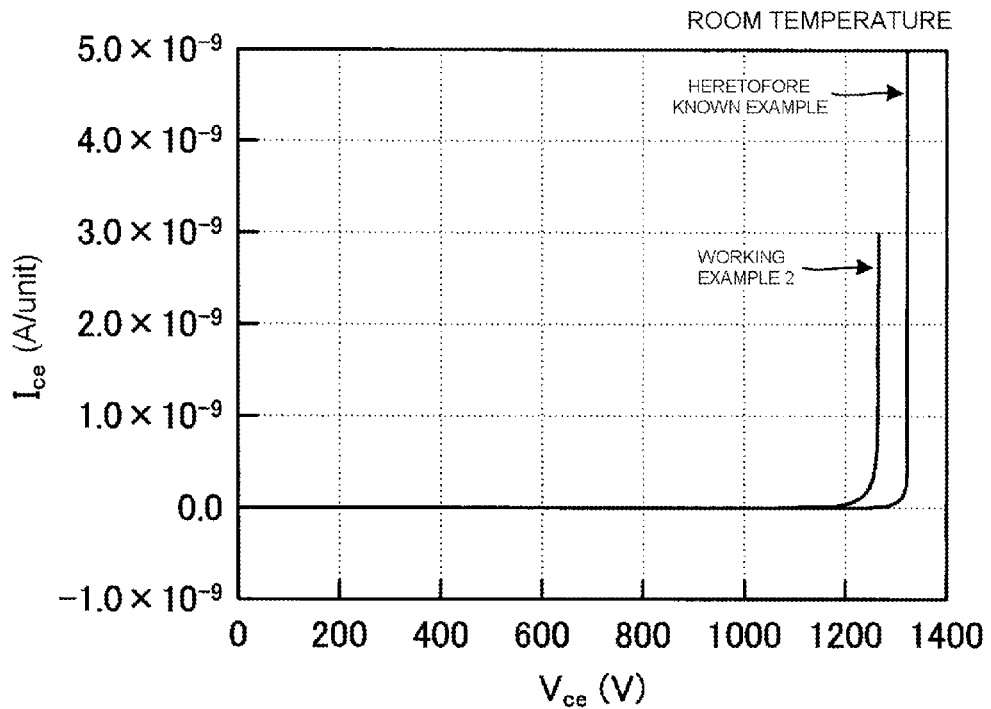
FIG. 15 is a characteristic diagram showing simulation results for $I_{ce}$-$V_{ce}$ characteristics of Working Example 2.

FIG. 15 is a characteristic diagram showing simulation results for $I_{ce}$-$V_{ce}$ characteristics of the semiconductor device of Working Example 2 and the semiconductor device of the heretofore known example. The simulation results shown in FIG. 15 are results in an off-condition at room temperature. From FIG. 15, it can be seen that the semiconductor device of Working Example 2 has a breakdown voltage equivalent to that of the semiconductor device of the heretofore known example.

Figure 16:
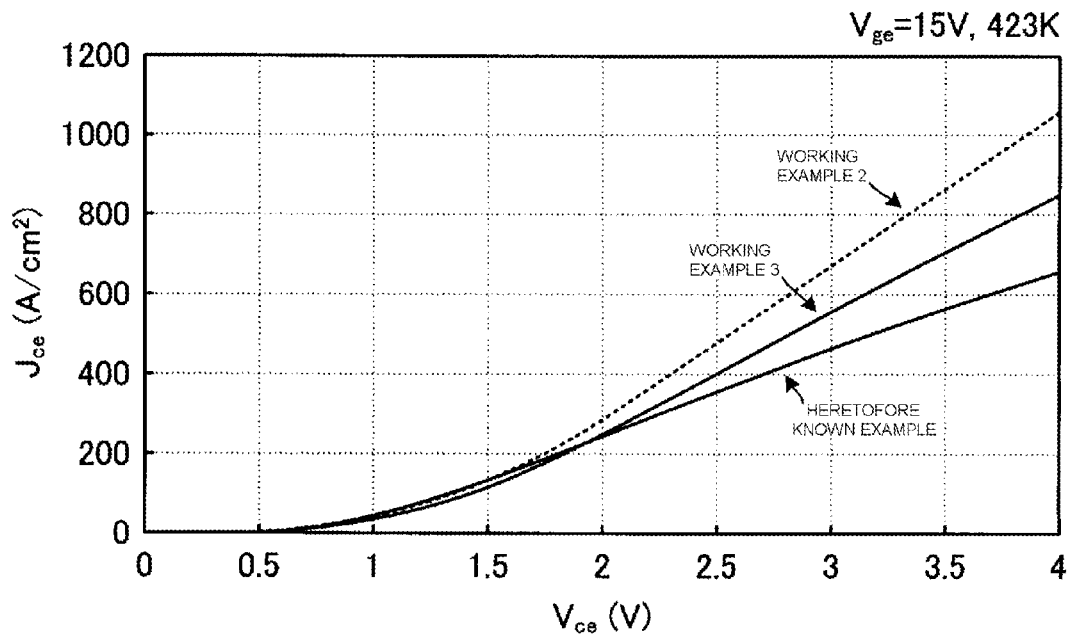
FIG. 16 is a characteristic diagram showing simulation results for $J_{ce}$-$V_{ce}$ characteristics of Working Examples 2 and 3.

FIG. 16 is a characteristic diagram showing simulation results for $J_{ce}$-$V_{ce}$ characteristics of the semiconductor device of Working Example 2 and the semiconductor device of the heretofore known example. $J_{ce}$ is the collector-emitter current density. The simulation results shown in FIG. 16 are results when the value of the gate-emitter voltage $V_{ge}$ is 15 V at a temperature of 423 K. From FIG. 16, it can be seen that the semiconductor device of Working Example 2 has a saturation current density higher than that of the semiconductor device of the heretofore known example. When it is necessary, in the semiconductor device of Working Example 2, to limit the saturation current density owing to a relationship with a short circuit capability SCSOA (short circuit safe operating area), or the like, it is sufficient to adjust the channel length, and adjust the length in the longitudinal direction of the trench 25.

The simulation results shown in FIG. 15 and FIG. 16 are obtained under the following conditions. A peak density at a depth of 0.2 μm from the collector electrodes 38 and 15 in the p-collector layers 36 and 14 is taken to be $3 \times 10^{17}$ cm$^{-3}$. The depth Xj of the p-n junction between the p-collector layers 36 and 14 and n-buffer layers 37 and 13 is taken to be 0.8 μm to 0.9 μm. The thickness of the n-buffer layers 37 and 13 is taken to be approximately 30 μm. A peak density of the n-buffer layers 37 and 13 in the vicinity of the depth Xj of the p-n junction with the p-collector layers 36 and 14 is taken to be $2.2 \times 10^{15}$ cm$^{-3}$. The thickness of the semiconductor substrate is taken to be 115 μm.

In the semiconductor device of Working Example 2, the density of the n$^-$ layer 21 is taken to be $6.5 \times 10^{13}$ cm$^{-3}$. In the emitter cells 22 and 71 of the semiconductor device of Working Example 2, the emitter length in the direction parallel to the trench is taken to be 0.6 μm. As three emitter cells 22 and 71 are grouped together in the semiconductor device of Working Example 2, the emitter length in the direction parallel to the trench of the three emitter cells 22 and 71 is 1.8 μm. A semicircular portion of the loop-form trench 25 is approximated by a quadrilateral. In the semiconductor device of the heretofore known example, the density of the n$^-$ layer 12 is taken to be $9 \times 10^{13}$ cm$^{-3}$. The emitter length in the direction parallel to the trench in the emitter cell 7 of the semiconductor device of the heretofore known example is taken to be 2.4 μm.

Figure 17:
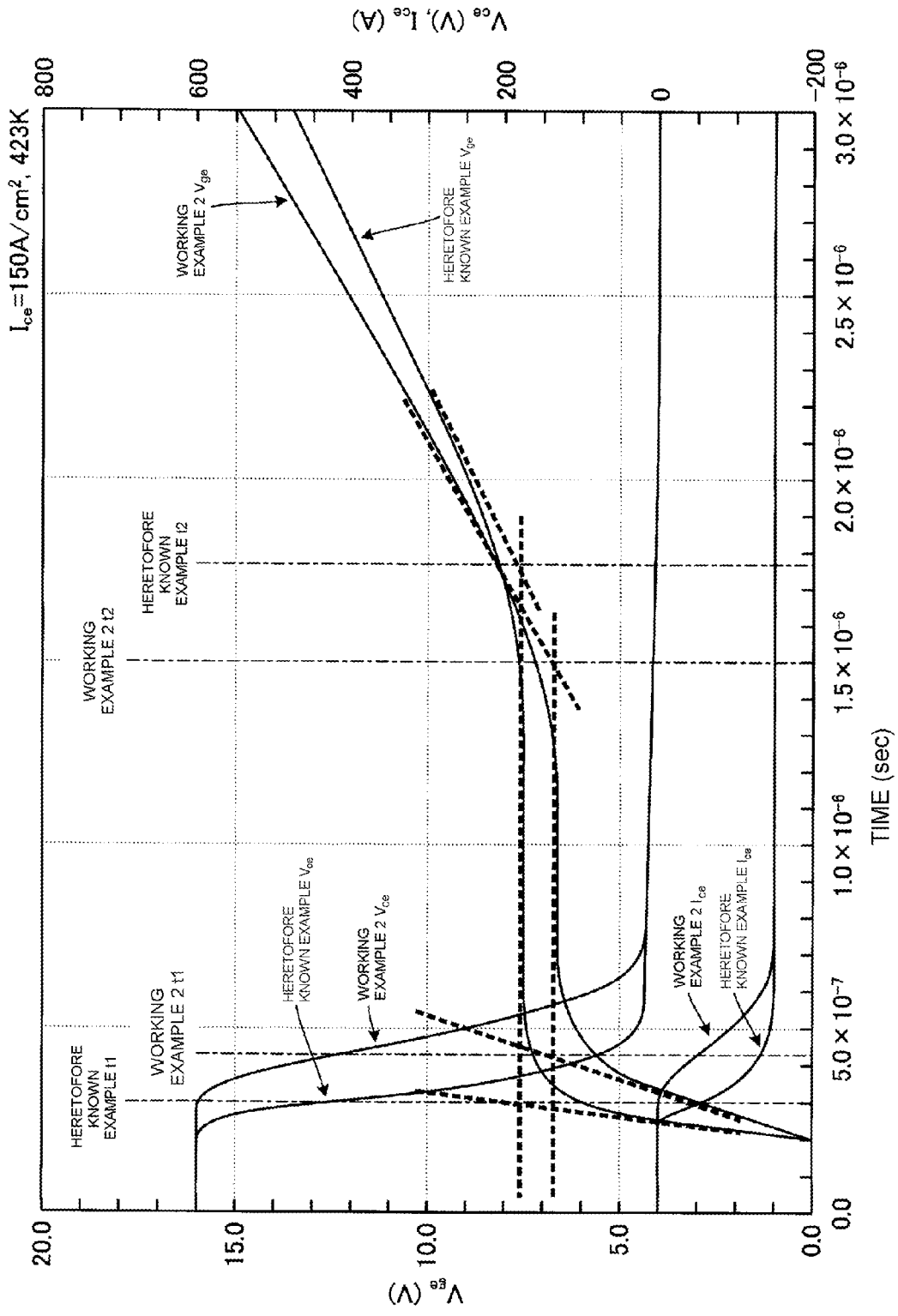
FIG. 17 is a characteristic diagram showing results of simulating a turning on process of Working Example 2.

Also, results of evaluating the mirror capacity of the semiconductor device of Working Example 2 and the semiconductor device of the heretofore known example using the evaluation circuit shown in FIG. 8, as in Working Example 1, are shown in FIG. 17. FIG. 17 is a characteristic diagram showing results of simulating the turning on process of the semiconductor device of Working Example 2 and the semiconductor device of the heretofore known example. Simulation conditions are that each of the semiconductor device of Working Example 2 and the semiconductor device of the heretofore known example is taken to be of a 150 A class, the operating temperature is taken to be 423 K, and the active area is taken to be 1 cm$^2$.

Based on FIG. 17, the starting time t1 and finishing time t2 of a plateau period of the gate-emitter voltage $V_{ge}$ is calculated in the same way as in Working Example 1. For the semiconductor device of Working Example 2, t1 is $4.84 \times 10^{-7}$ seconds, while t2 is $1.50 \times 10^{-6}$ seconds. Consequently, the plateau period of the gate-emitter voltage $V_{ge}$ is $1.016 \times 10^{-6}$ seconds. For the semiconductor device of the heretofore known example, t1 is $3.01 \times 10^{-7}$ seconds, while t2 is $1.77 \times 10^{-6}$ seconds. Consequently, the plateau period of the gate-emitter voltage $V_{ge}$ is $1.469 \times 10^{-6}$ seconds.

From these results, the mirror capacitance of the semiconductor device of Working Example 2 decreases by 30.83% with respect to that of the heretofore known example. Also, the ratio between the mirror capacitance of the semiconductor device of Working Example 2 and an input capacitance $C_{ge}$ ($C_{gc}/C_{ge}$) is in the region of one-fourth of the ratio between the mirror capacitance of the semiconductor device of the heretofore known example and the input capacitance $C_{ge}$.

WORKING EXAMPLE 3

Figure 18:
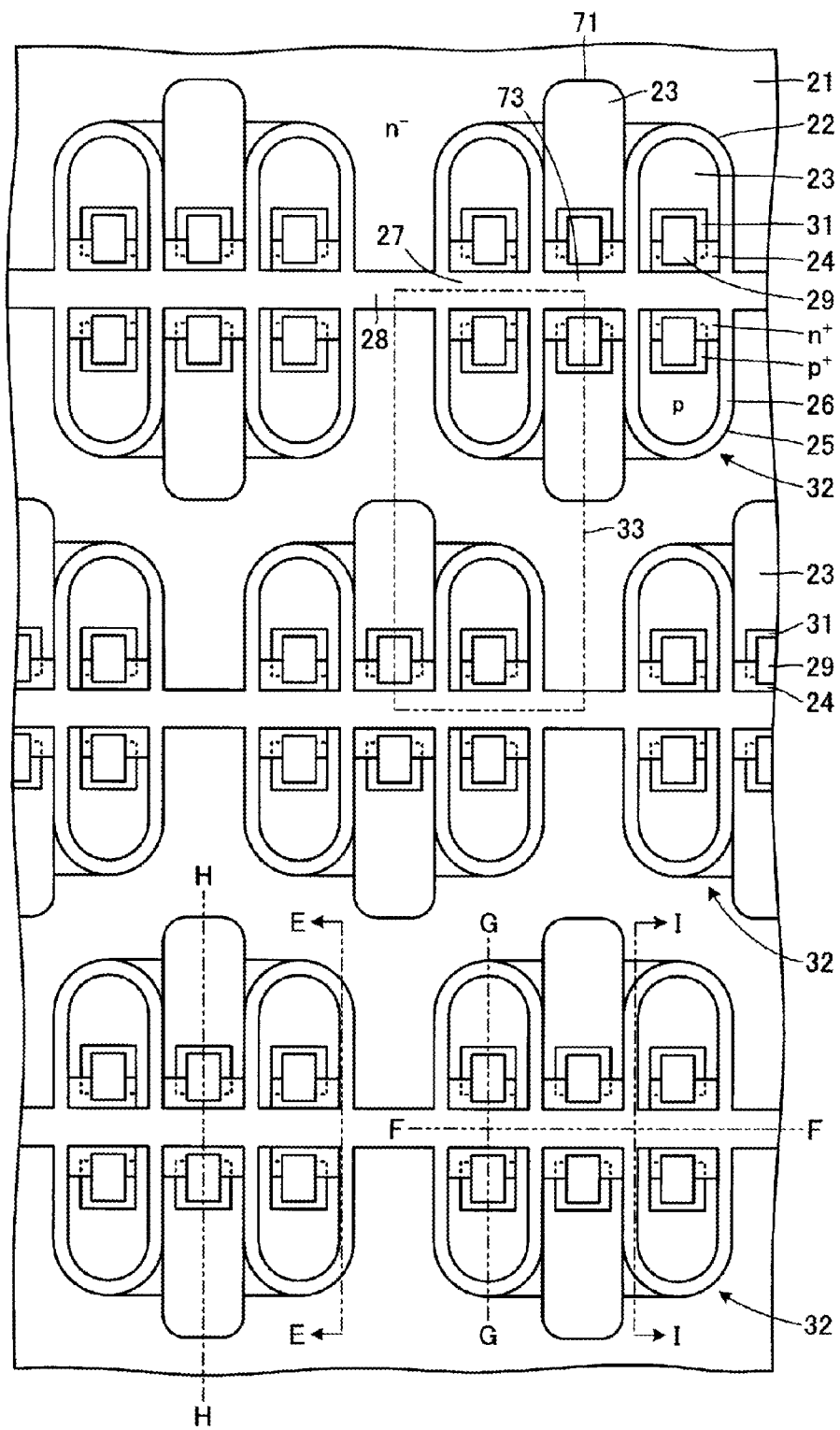
FIG. 18 is a plan layout diagram showing Working Example 3 of the semiconductor device according to the embodiment.
Figure 19:
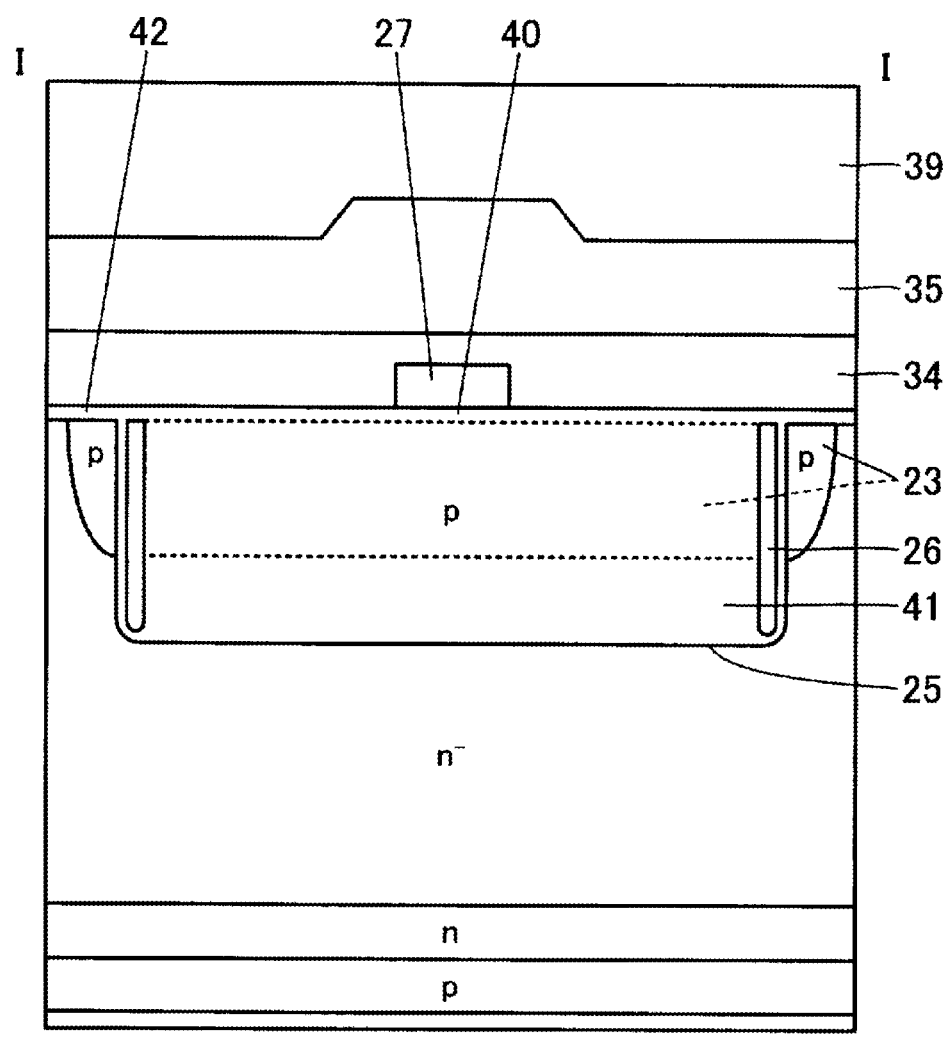
FIG. 19 is a sectional view showing Working Example 3 of the semiconductor device according to the embodiment.

FIG. 18 is a plan layout diagram showing Working Example 3 of the semiconductor device according to the embodiment. A gate insulating film, an interlayer insulating film, an emitter electrode, and a passivation film are omitted from FIG. 18. FIG. 19 is a sectional view along a section line I-I in FIG. 18. The section line I-I follows a first gate insulating film of a trench side wall that is not in contact with the n$^+$ emitter region 24. The configurations of cross-sections along a section line E-E, a section line F-F, a section line G-G, and a section line H-H in FIG. 18 are the same as the configurations of the cross-sections along the section line E-E, the section line F-F, the section line G-G, and the section line H-H respectively of FIG. 10 of Working Example 2.

As shown in FIG. 18 and FIG. 19, the semiconductor device of Working Example 3 differs from the semiconductor device of Working Example 2 in the following points. In the semiconductor device of Working Example 2, both ends of the n$^+$ emitter region 24 are in contact with a trench side wall (refer to FIG. 10). As opposed to this, in the semiconductor device of Working Example 3, one end portion of the n$^+$ emitter region 24 in the emitter cell 22 provided in a region closed off by the trench 25 is distanced from the trench side wall. Other configurations are the same as in Working Example 2.

As the channel length of the semiconductor device of Working Example 3 is less than that of the semiconductor device of Working Example 2 owing to one end portion of the n+ emitter region 24 being distanced from the trench side wall, it is possible to suppress the saturation current density. Simulation results for $J_{ce}$-$V_{ce}$ characteristics of the semiconductor device of Working Example 3 are also shown in FIG. 16. The simulation conditions are the same as in Working Example 2. From FIG. 16, it can be seen that the saturation current density is suppressed more in the semiconductor device of Working Example 3 than in the semiconductor device of Working Example 2.

According to the embodiment, the trench gate structure is provided only in the regions in which the emitter cells 22 and 71 exist, and is not provided in regions between the emitter cells 22 and 71 in which there are no emitter cells 22 or 71. Consequently, the width of the first gate insulating film 41 in the gate trench is shorter than that heretofore known. Also, using the second gate electrodes 27 and 73 and the conductive region 28, it is possible to transmit a gate signal to the first gate electrode 26 of the emitter cells 22 and 71 scattered in island-form. In Working Example 2 and Working Example 3, it is also possible to transmit a gate signal to the second gate electrode 73. Consequently, it is possible to reduce the mirror capacitance. By the mirror capacitance being reduced, the plateau period of the gate-emitter voltage $V_{ge}$ when turning on and turning off is shortened. As switching loss is reduced as a result of this, it is possible to improve a trade-off between a turn-off loss Eoff and an on-voltage Von. Also, even when the gate voltage is raised by the effect of a bus (collector) voltage surge when in an off-condition, the amount of gate voltage rise is small, meaning that the probability of malfunctioning and shifting to an on-condition decreases.

The invention not being limited to the heretofore described working examples, various changes are possible. For example, the numerical values of the dimensions, concentrations, electrical characteristics, and the like, shown in the embodiment being examples, the invention is not limited to these values. Also, in each working example, the first conductivity type is taken to be the n-type and the second conductivity type taken to be the p-type, but the invention is established in the same way even when taking the first conductivity type to be the p-type and the second conductivity type to be the n-type.

Industrial Applicability

As heretofore described, the semiconductor device according to the invention is useful as a semiconductor device including a trench gate structure, and in particular, is suitable as an IGBT.

Description Of Reference Numerals And Signs
21 First conductivity type semiconductor layer
22, 71 Cell
23 Second conductivity type semiconductor region
24 First conductivity type semiconductor region
25 Trench
26 First electrode
27, 73 Second electrode
28 Conductive region
29 Contact region
32 Trench group
35 Third electrode
36 Second conductivity type semiconductor layer
38 Fourth electrode
40, 72 Second insulating film
41 First insulating film
42 Third insulating film

The invention claimed is:

1. A semiconductor device, characterized by comprising:
a first conductivity type semiconductor layer;
a plurality of island-form cells provided distanced from each other on a first main surface of the first conductivity type semiconductor layer;
a second conductivity type semiconductor region provided in the cell;
a first conductivity type semiconductor region provided in the second conductivity type semiconductor region;
a first insulating film provided inside a trench deeper than the second conductivity type semiconductor region formed on either side of the cell;
a first electrode embedded in the trench across the first insulating film;
a second insulating film provided on a surface of a region of the second conductivity type semiconductor region sandwiched by the first conductivity type semiconductor region;
a second electrode, formed on the second insulating film, that electrically connects first electrodes;
a third insulating film provided on a surface of the first conductivity type semiconductor layer;
a conductive region, formed on the third insulating film, that electrically connects second electrodes; and
a contact region that is isolated from the second electrode, and that short circuits the second conductivity type semiconductor region and the first conductivity type semiconductor region provided in the region,
wherein the first conductivity type semiconductor layer is exposed on the first main surface.

2. The semiconductor device according to claim 1, characterized in that
the second electrode and the conductive region also act as a wire that transmits a gate signal.

3. The semiconductor device according to claim 1, characterized in that
a plurality of trench groups, each including a plurality of the trench, are disposed distanced from each other,
a plurality of the trench are disposed aligned in a direction intersecting with the longitudinal direction of the trench in each trench group, and
the cells are disposed alternately in neighboring trench groups.

4. The semiconductor device according to claim 3, characterized in that
the second electrode and the conductive region also act as a wire that transmits a gate signal.

5. The semiconductor device according to claim 4, characterized by comprising:
a third electrode electrically connected to the contact region;
a second conductivity type semiconductor layer provided on a second main surface of the first conductivity type semiconductor layer; and
a fourth electrode electrically connected to the second conductivity type semiconductor layer.

6. The semiconductor device according to claim 1, characterized in that
the trenches disposed on either side of the cell are connected, and
the cell is provided in a region closed off by the trenches disposed on either side of the cell.

7. The semiconductor device according to claim 6, characterized in that
the second electrode and the conductive region also act as a wire that transmits a gate signal.

8. The semiconductor device according to claim 6, characterized in that
the cell is also disposed in one portion of regions between neighboring regions closed off by the trenches,
the second conductivity type semiconductor region provided in the cell between regions closed off by the trenches extends farther in the longitudinal direction of the trench than the trenches surrounding the region closed off by the trenches, and
the second electrode that electrically connects first electrodes is also provided across the second insulating film on a surface of a region of the second conductivity type semiconductor region provided in the cell between regions closed off by the trenches sandwiched by the first conductivity type semiconductor region provided in the second conductivity type semiconductor region.

9. The semiconductor device according to claim 8, characterized in that
the second electrode and the conductive region also act as a wire that transmits a gate signal.

10. The semiconductor device according to claim 8, characterized in that
a plurality of trench groups, each including a plurality of the trench, are disposed distanced from each other,
a plurality of the trench are disposed aligned in a direction intersecting with the longitudinal direction of the trench in each trench group, and
the cells between regions closed off by the trenches are disposed alternately in neighboring trench groups.

11. The semiconductor device according to claim 10, characterized in that
the second electrode and the conductive region also act as a wire that transmits a gate signal.

12. The semiconductor device according to claim 11, characterized by comprising:
a third electrode electrically connected to the contact region;
a second conductivity type semiconductor layer provided on a second main surface of the first conductivity type semiconductor layer; and
a fourth electrode electrically connected to the second conductivity type semiconductor layer.

* * * * *